(12) United States Patent
Montoya et al.

(10) Patent No.: US 9,318,517 B1
(45) Date of Patent: Apr. 19, 2016

(54) WAFER LEVEL INTEGRATION OF FOCAL PLANE ARRAYS HAVING A FLEXIBLE CONDUCTIVE LAYER TO PROVIDE AN OPTICAL APERTURE FOR EACH PIXEL

(71) Applicant: STC.UNM, Albuquerque, NM (US)

(72) Inventors: John A Montoya, Albuquerque, NM (US); Sanjay Krishna, Albuquerque, NM (US); Stephen Myers, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 86 days.

(21) Appl. No.: 14/290,619

(22) Filed: May 29, 2014

Related U.S. Application Data

(60) Provisional application No. 61/828,668, filed on May 29, 2013.

(51) Int. Cl.
*H01L 27/146* (2006.01)

(52) U.S. Cl.
CPC .... *H01L 27/14601* (2013.01); *H01L 27/14687* (2013.01)

(58) Field of Classification Search
CPC ............ H01L 27/14625; H01L 27/14632; H01L 27/14601; H04N 5/2252
USPC ........... 250/208.1, 214 R, 239; 257/290–292, 257/440–444, 432–436; 348/294–311
See application file for complete search history.

(56) References Cited

U.S. PATENT DOCUMENTS

| | | | |
|---|---|---|---|
| 5,146,303 A * | 9/1992 | Kornrumpf | ............ H01L 24/49 250/332 |
| 5,773,831 A | 6/1998 | Brouns et al. | |
| 5,989,933 A | 11/1999 | Bevan et al. | |
| 8,452,134 B1 | 5/2013 | Davids et al. | |
| 2006/0000974 A1 | 1/2006 | Brouns | |

OTHER PUBLICATIONS

"Nanonex Nanoimprint Tools & Solutions", [online]. © 2008 Nanonex Corporation. [archived Mar. 13, 2013]. Retrieved from the Internet: <URL: https://web.archive.org/web/20130313051315/http://www.nanonex.com/>, (2008), 1 pg.

Kuznetsova, Yuliya, et al., "Imaging interferometric microscopy—approaching the linear systems limits of optical resolution", *Opt. Express*, 15, (2007), 6651-6663.

* cited by examiner

*Primary Examiner* — Que T Le
(74) *Attorney, Agent, or Firm* — Schwegman Lundberg & Woessner, P.A.

(57) ABSTRACT

Apparatus, systems, and methods related to focal plane arrays can be used in a variety of applications. In various embodiments, focal plane arrays can be fabricated on a wafer integration level based on arrangement of a flexible conductive layer for photosensitive pixels of the focal plane arrays. Arrangement of a flexible conductive layer allows for a number of architectures of focal plane arrays. Additional apparatus, systems, and methods are disclosed.

28 Claims, 23 Drawing Sheets

US 9,318,517 B1

WAFER LEVEL INTEGRATION OF FOCAL PLANE ARRAYS HAVING A FLEXIBLE CONDUCTIVE LAYER TO PROVIDE AN OPTICAL APERTURE FOR EACH PIXEL

RELATED APPLICATION

This application claims priority under 35 U.S.C. 119(e) from U.S. Provisional Application Ser. No. 61/828,668, filed 29 May 2013, which application is incorporated herein by reference in its entirety.

FIELD OF THE INVENTION

The invention relates generally to semiconductor based structures, devices, and processing techniques.

BACKGROUND

Focal plane arrays (FPAs), based on their imaging capabilities can be utilized for a wide range of applications, ranging from medical diagnostics to military defense and to environmental monitoring. The development of a new generation of FPAs is primarily hindered upon their effective design and fabrication. A typical FPA is primarily composed of an array of pixels with a bottom electrical contact, a photodetector, and a top electrical contact. The bottom contact is formed on the bottom side of each pixel in the array. The top contact is defined at the base of the pixel array along its boundary. The top contact makes electrical contact to the pixel array through a common, relatively thick semiconductor ground plane. A completed FPA is bonded to a read-out integrated circuit (ROIC) with conductive bonding pads and epoxy.

During the fabrication process, each FPA requires a substrate removal step to effectively allow reception of incoming radiation to the pixel array. With such a FPA architecture as discussed above, substrate removal is performed on a single FPA at the die level, making the process slow and expensive to perform. Also, the option for additional chip processing after substrate removal is not easily possible. Backside patterning is also performed one die at a time. Further, excess epoxy in bonding to the ROIC can prevent use of contact photolithography techniques after substrate removal.

In addition to typical FPA fabrication methods using single die processing, the ROIC is susceptible to damage during substrate removal, which can reduce device yield and increase fabrication costs. Also, a thick semiconductor ground plane used in conventional FPAs leads to radiation lost in the doped semiconductor contact layers leading to poor absorption efficiency. Further, the doped semiconductor layer often cracks when the FPA is cycled between room and cryogenic temperatures for image acquisition, which significantly limits the lifetime of the imaging system. Furthermore, additional chip processing after substrate removal is inefficient. Patterning a high resolution structure, such as a frequency selective surface, is inefficient due to existing structures that interfere during photolithography.

BRIEF DESCRIPTION OF THE DRAWINGS

Embodiments of the invention are illustrated by way of example and not limitation in the figures of the accompanying drawings in which.

DETAILED DESCRIPTION

The following detailed description refers to the accompanying drawings that show, by way of illustration and not limitation, various example embodiments of the invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments of the invention, a new FPA architecture, along with variations thereof, relates to the efficient design and fabrication of a focal plane array for its improved performance and mass fabrication and can be employed to overcome the fabrication challenges of typical FPA processing. A new FPA architecture, along with variations thereof, allows substrate removal and the option for additional fabrication steps on the wafer level. Through such processes, a lower fabrication time and cost may result with enhanced system functionality. This new FPA architecture, along with variations thereof, redefines key components of a conventional FPA and makes use of three-dimensional wafer processing techniques to achieve certain design goals. In various embodiments, similar to a conventional FPA processing, the bottom contact is formed on the bottom side of each pixel in the array. However, the top contact is no longer defined by a highly doped semiconductor ground plane. The top contact can be defined by a flexible, highly conductive layer directly on the backside of each pixel in the array with an optical aperture. The flexible, highly conductive layer can be realized by a metallic contact plane. Besides flexible metals and flexible metal composites, other flexible metallic-like materials can be used, which can include conductive polymers and conductive oxides, among others. This structure can provide a FPA that has a longer thermal cycle lifetime in addition to a photodetector with very thin semiconductor contact layers. In addition, redefining the ground plane enables the design and fabrication of new, highly advanced FPAs. Such a new generation of focal plane arrays (FPAs) can be utilized for enhanced imaging capability with a low system cost on the wafer level.

Figure 1:
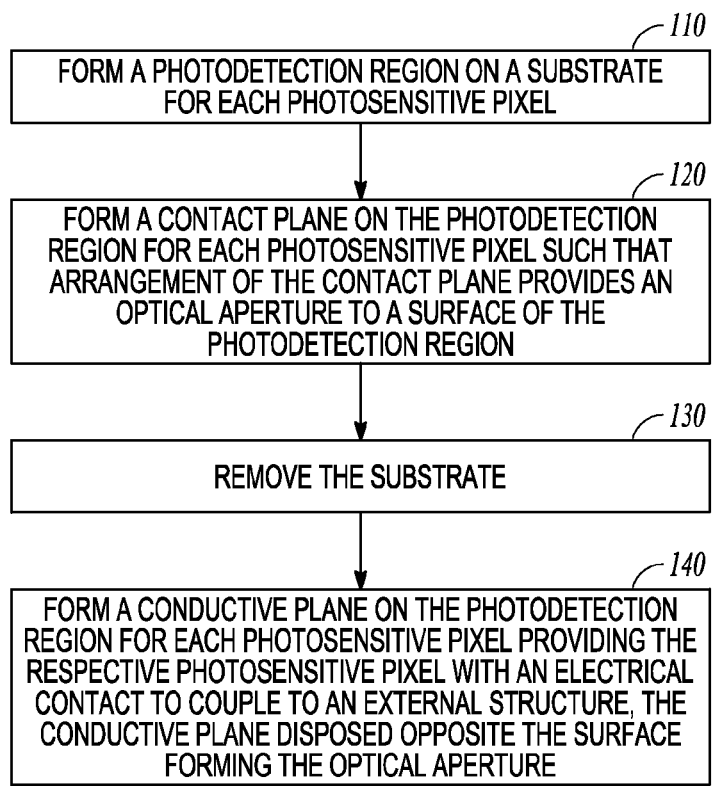
FIG. 1 shows features of an example method of fabricating focal plane arrays having an array of photosensitive pixels, in accordance with various embodiments.

FIG. 1 shows features of an example embodiment of a method of fabricating focal plane arrays having an array of photosensitive pixels. At 110, a photodetection region is formed on a substrate for each photosensitive pixel. The photodetection region can include a photodetector and its contacts. With a semiconductor-based photodetector, its contacts can be doped semiconductor regions. Forming the photodetection region on the substrate can include forming the photodetection region onto an etch stop layer on the substrate. The etch stop layer can be used in subsequent processing to remove the substrate from the focal plane array.

At 120, a contact plane is formed on the photodetection region for each photosensitive pixel such that arrangement of the contact plane provides an optical aperture to a surface of the photodetection region. The contact plane is formed as a flexible, highly conductive layer. The flexible, highly conductive layer can be realized by flexible metals, flexible metal composites, and flexible metallic-like materials, which can include conductive polymers and conductive oxides, among others. The term "contact plane" is used herein to refer to a layer or an extended structure and is not limited to a flat structure. Depending on the details of the structure of the photosensitive pixels, prior to forming the contact plane, an electrically insulating layer, such as a passivation layer, can be formed such that insulation material contacts and covers sides of the photodetection region from a top surface of the photodetection region to a bottom surface of the photodetection region. Depending on the details of the structure of the photosensitive pixels, forming the contact plane can include forming the contact plane disposed on edges of the photodetection region such that arrangement of the contact plane on the edges provides the optical aperture to the photodetection region. The contact plane can extend inward from the edges to a selected distance depending on the architecture being processed. Forming the contact plane can include forming the contact plane of each photosensitive pixel common to the other photosensitive pixels of the focal plane array.

At 130, the substrate is removed. At 140, a conductive plane is formed on the photodetection region for each photosensitive pixel providing the respective photosensitive pixel with an electrical contact to couple to an external structure, the conductive plane disposed opposite the surface forming the optical aperture. The external structure can be a read-out integrated circuit. In various embodiments of fabrication of a focal plane array, fabricating the focal plane array includes using three-dimensional semiconductor wafer processing techniques. Fabricating the focal plane array can include fabricating the focal plane array as one of a plurality of focal plane arrays on a wafer, and electrically coupling the conductive plane to the external structure, such as a read-out integrated circuit, can include electrically coupling the conductive plane to one of a plurality of external structures, such as read-out integrated circuits, on the other wafer. Electrically coupling the conductive plane to the external structure, such as a read-out integrated circuit, on the other wafer can include flip-chip bonding the conductive plane to the read-out integrated circuit.

In various embodiments of methods of fabricating a focal plane array, features of these methods can further include attaching a handle wafer such that the contact plane is between the handle wafer and the substrate; removing the substrate using the handle wafer; electrically coupling the conductive plane to an external structure, such as a read-out integrated circuit, on another wafer; and removing the handle wafer after electrically coupling the conductive plane to the external structure, such as a read-out integrated circuit. Attaching the handle wafer can include attaching a handle wafer having a temporary bond polymer to couple to the contact plane, the temporary bond polymer removable with removal of the handle wafer.

Embodiments of methods of fabricating a focal plane array can include using similar processing features identical to or similar to one or more features discussed above. In addition, processing features can include additions or modifications to fabricate different architectures of focal plane arrays that also provide wafer scale integration. Methods can include forming a frequency selective surface on the photodetection region for each photosensitive pixel and performing the forming of the contact plane on the photodetection region such that the frequency selective surface is within the optical aperture formed by the arrangement of the contact plane. Frequency selective surfaces are structures that can provide filtering of electromagnetic waves, which filtering is mainly frequency filtering. A frequency selective surface, as used herein, provides a mechanism to aid coupling of incoming radiation into a photodetector. A frequency selective surface can be made of metal, a dielectric, or any form in between. An electrically insulating layer can also be placed directly below the frequency selective surface layer, which can help electrically separate the frequency selective surface and the photodetector. This electrically insulating layer can be transparent at wavelengths for which the photodetector is constructed.

Methods can include, after forming the conductive plane, forming an electrically insulating layer, such as a passivation layer, partially on the conductive plane leaving access to a portion of the conductive plane and processing the electrically insulating layer with respect to the portion of the conductive contact such that the portion of the conductive contact is arranged to couple to an external structure, such as a read-out integrated circuit; and forming a conductive contact on the electrically insulating layer extending to and contacting the contact plane, the conductive contact arranged to couple to the external structure, such as a read-out integrated circuit, electrically isolated from the coupling of the portion of the conductive contact to the external structure. Other methods, which provide multiple contacts from a photosensitive pixel to external structure, such as a ROIC, can also include forming a frequency selective surface on the photodetection region for each photosensitive pixel and performing the forming of the contact plane on the photodetection region such that the frequency selective surface is within the optical aperture formed by the arrangement of the contact plane.

Methods can further include forming a frequency selective surface on the photodetection region for each photosensitive pixel and performing the forming of the contact plane on the photodetection region such that the frequency selective surface is within the optical aperture formed by the arrangement of the contact plane; and forming a control gate coupled to the photodetection region such that each photosensitive pixel is electrically isolated from the other photosensitive pixels of the focal plane array. Depending on the architecture for the photosensitive pixels of the focal plane array, features of different methods discussed herein can be used. In addition, in the methods and architectures taught herein, material optionally may be formed on the respective pixel over the optical aperture region of the pixel using material that is transparent to incident electromagnetic radiation at wavelengths for which the pixel, hence the focal plane array, is designed. The various features fabricated can be realized using semiconductor process techniques such as, but not limited to, chemical vapor deposition, molecular beam epitaxy, atomic layer deposition, chemical mechanical polishing, etching, and/or other semiconductor processing, and combinations thereof.

Figure 2:
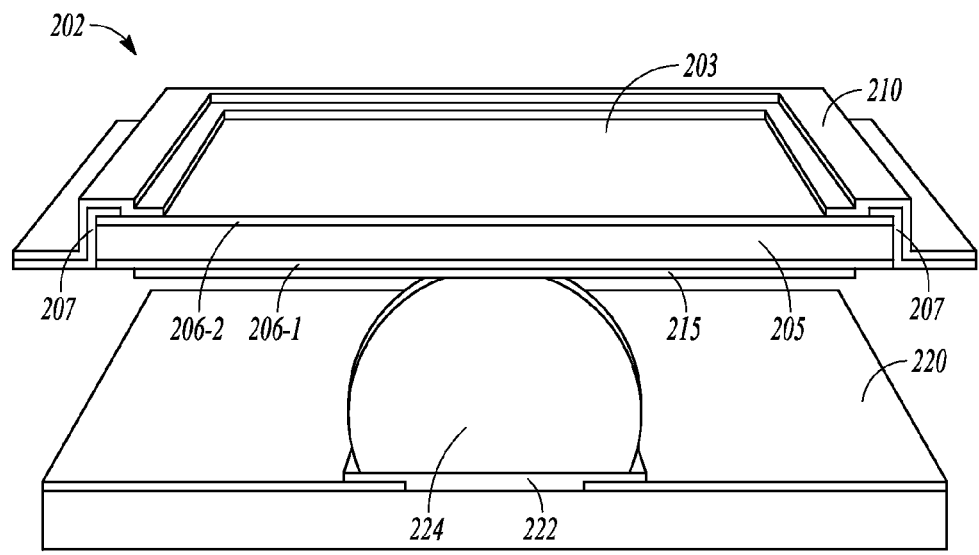
FIG. 2 is a representation of an example architecture of a pixel of a focal plane array, in accordance with various embodiments.

FIG. 2 is a representation of an architecture of a pixel 202 of a focal plane array. Pixel 202 is a photosensitive pixel, which can be fabricated using wafer level integration. Pixel 202 comprises photodetector 205, an electrical contact 215, and a contact plane 210 with an optical aperture 203 to the photodetector 205. Contact plane 210 can be a flexible, highly conductive layer, which flexible, highly conductive layer can be realized by flexible metals, flexible metal composites, and flexible metallic-like materials that can include conductive polymers and conductive oxides, among others. Contact plane 210 can be conductively coupled to photodetector 205 and disposed on photodetector 205 such that arrangement of contact plane 210 provides an optical aperture 203 to the photodetector 205. Photodetector 205 can be conductively coupled to electrical contact 215, and electrical contact 215 can be arranged to couple to a device or circuit external to the focal plane array. For example, the external device or circuit can be a read-out integrated circuit (ROIC) 220.

If contact plane 210 is formed on a portion of the top of photodetector 205 and along the sides of photodetector 205, contact plane 210 can be separated from the sides of photodetector 205 by a dielectric material, which is an electrical insulator 207. The photodetector 205 can use contact layers 206-1 and 206-2 of doped semiconductor material. Contact layers 206-1 and 206-2 can be realized as ultra-thin doped contacts, which may be highly doped. Alternatively, contact layers 206-1 and 206-2 may be limited to regions contacting contact plane 210. With contact layers 206-1 and 206-2 limited to regions contacting contact plane 210, contact layers 206-1 and 206-2 may be ohmic contacts depending on the type of detector used for photodetector 205.

Pixel 202 of the FPA is one of a number of photosensitive pixels. The pixels can be arranged in a format of rows and columns. Other arrangements of pixels 202 can be formed for the focal plane array. Each pixel of the FPA can be structured substantially the same, such that each pixel 202 is a unit cell of the FPA. Contact plane 210 can provide optical isolation between unit cells. Contact plane 210 can be arranged as a metallic ground plane for the unit cells of the FPA. Contact plane 210 of each photosensitive pixel can be common to the other photosensitive pixels of the focal plane array. Contact plane 210 can be disposed on edges of the photodetector 205 such that arrangement of the contact plane 210 on the edges provides the optical aperture 203 to the photodetector 205. Contact plane 210 can extend inward from the edges to a selected distance depending on the architecture being processed.

As noted, ground plane 210 can be composed of metallic-like material that provides flexibility. Besides flexible metals and metal composites, flexible metallic-like materials can include conductive polymers and conductive oxides, among others. Electrical contact 215 may also use metallic-like material. Electrical contact 215 may be composed of the same material as that of ground plane 210 or of another metallic-like material that provides flexibility. Use of such material for ground plane 210 can provide a FPA with increased thermal cycle lifetime as compared to using a semiconductor ground plane and can provide the FPA with optical isolation between unit cells.

Pixel 202 of focal plane array can be bonded to an external circuit, such as ROIC 220. ROIC 220 can be bonded to the focal plane array with a conductive bonding pad 222 conductively coupled to electrical contact 215 of each respective photosensitive pixel 202. The conductive coupling can be realized using a conductive interconnect such as, but not limited to, a solder bump 224, referred to herein as a bump, such as used in flip-chip bonding. The bump 224 can be an indium bump. Each pixel of the focal plane array may be bonded in the same manner to ROIC 220.

The architecture of pixels 202 for a focal plane array using flexible, highly conductive ground plane 210 avoids the use of a semiconductor ground plane, where use of the semiconductor ground plane can place limits on processing. Each pixel 202 includes electrical contacts on both sides of the respective pixel 202, where the doped semiconductor contacts 206-1, 206-2, used to couple photodetector 205 to electrical contacts, can be very thin. The active region of the photodetector 205 can be relatively thick or thin.

Figure 3A:
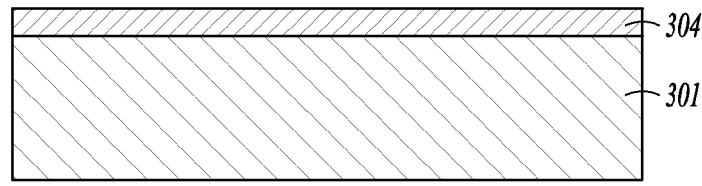
FIGS. 3A-3H show features of an example method of fabricating focal plane arrays, in accordance with various embodiments.
Figure 3B:
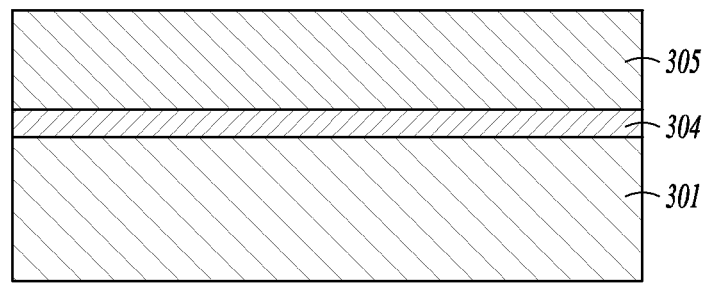

FIGS. 3A-3H show features of an embodiment of a method of fabricating focal plane arrays. Each focal plane array has an array of photosensitive pixels. This method can be used to fabricate the pixels of the focal plane array represented in FIG. 2. Processing as shown in FIGS. 3A-3H provides a mechanism to fabricate focal plane arrays and apply these focal plane arrays to control circuits on a wafer level. FIG. 3A is a representation of a substrate 301 after an etch stop layer 304 has been applied to substrate 301. A photodetection region 305 can be formed on etch stop layer 304. Photodetection region 305 can include a semiconductor-based photodetector having an active region and outer layers doped to provide contacts to the active region. One of the outer layers can contact etch stop layer 304 and another outer layer can be disposed at the surface region of photodetection region 305, opposite etch stop layer 304. FIG. 3B is a representation of photodetection region 305 disposed on etch stop layer 304 on substrate 301 after photodetection region 305 has been formed.

Figure 3C:
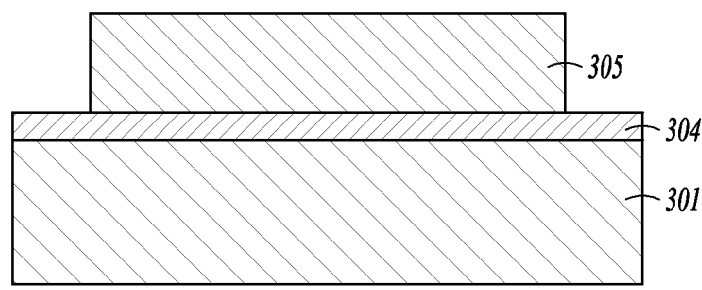

FIG. 3C is a cross-sectional view showing photodetection region 305 on etch stop layer 304 on substrate 301 after processing to etch photodetection region 305 to provide photodetection regions for each pixel of the focal plane arrays being fabricated. The etch provides mesa 305 as a photodetection region for a pixel. Alternatively, the active regions and contacts of photodetection region 305 can be formed after mesa etch of layers provided to form photodetection region 305.

Figure 3D:
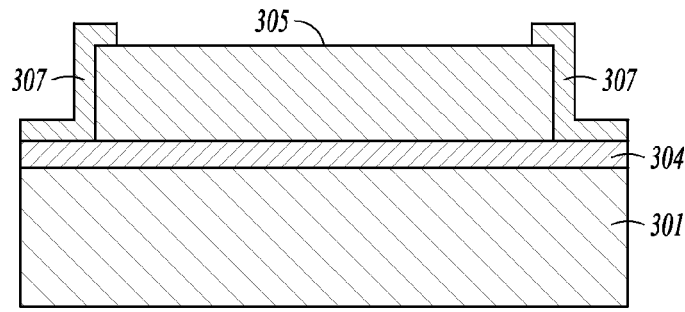

FIG. 3D is a cross-sectional view showing electrically insulating material 307 formed on the sides of photodetection region 305. Electrically insulating material 307 can be a passivation layer. Electrically insulating material 307 can extend from a top surface of photodetection region 305 to etch stop layer 304. Electrically insulating material 307 may be disposed to extend from an end of the top surface of photodetection region 305 inwards along the top surface. Electrically insulating material 307 may be disposed to extend from an end of the sides of photodetection region 305 outward along etch stop layer 304.

Figure 3E:
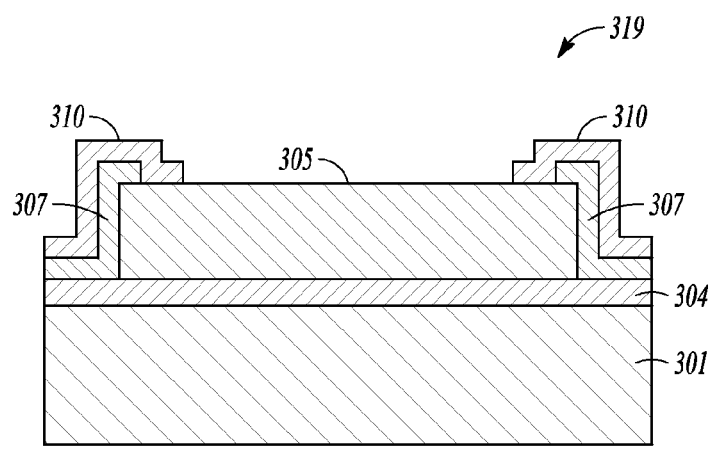

FIG. 3E is a cross-sectional view showing a contact plane 310 formed on photodetection region 305. Contact plane 310 can be formed using a highly conductive metallic-like material that provides flexibility. Besides flexible metals and metal composites, flexible metallic-like materials can include conductive polymers and conductive oxides. In each focal plane array of the wafer being processed, contact plane 310 may be formed with respect to the pixels of a focal plane array to provide a common ground metal. Contact plane 310 can be formed to cover electrically insulating material 307 adjacent photodetection region 305, extending from electrically insulating material 307 on the top surface of photodetection region 305 to contact photodetection region 305. Contact plane 310 can be formed to cover electrically insulating material 307 along sides of photodetection region 305, extending from the electrically insulating material 307 above the top surface of photodetection region 305 towards the portion of electrically insulating material 307 contacting etch stop 304.

Contact plane 310 is conductively coupled to the photodetector of photodetection region 305 and disposed onto and contacting photodetection region 305 such that arrangement of the contact plane 310 can provide an optical aperture to photodetection region 305 and hence to the photodetector of photodetection region 305. As can be seen in FIG. 3E, contact plane 310 can be disposed on edges of photodetection region 305 such that arrangement of the contact plane on the edges can provide the optical aperture to photodetection region 305. At this stage of processing, photodetection region 305 is disposed on etch stop layer 304 on substrate 301 providing a first constructed wafer 319.

A handle wafer can be attached to the first constructed wafer 319 of FIG. 3E. The handle wafer can be used to remove substrate 301 and etch stop layer 304. Removal of substrate 301 may be processed by mechanically polishing down to etch stop layer 304 with chemical etching to remove residual material of substrate 301. Chemicals can be applied to selectively remove etch top layer 304. Other removal techniques can be used such as by epitaxial liftoff. By using a handle wafer, substrate 301 can be removed from all focal plane array dies simultaneously.

Figure 3F:
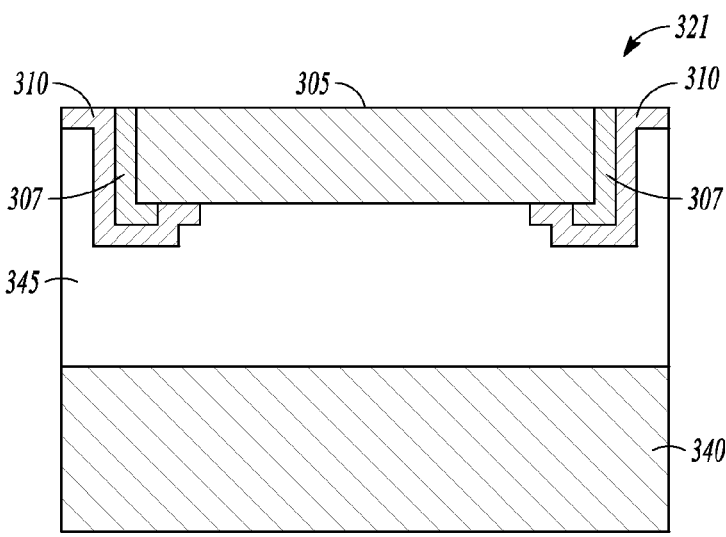

FIG. 3F shows a cross-sectional view of the first constructed wafer 319 after substrate 301 and etch stop layer 304 have been removed providing a second constructed wafer 321. Second constructed wafer 321 includes focal plane arrays having pixels, being formed, coupled to a handle wafer 340. Handle wafer 340 can be attached using a temporary bond polymer 345, where temporary bond polymer 345 separates the pixels being constructed from handle wafer 340. Temporary bond polymer 345 can be spin coated on one or both of constructed wafer 319 and handle wafer 340 with heat and pressure applied to accomplish the attachment or bonding. Room temperature processing of the attachment or bonding may be realized with temporary bond polymer 345 having appropriate viscosity.

Figure 3G:
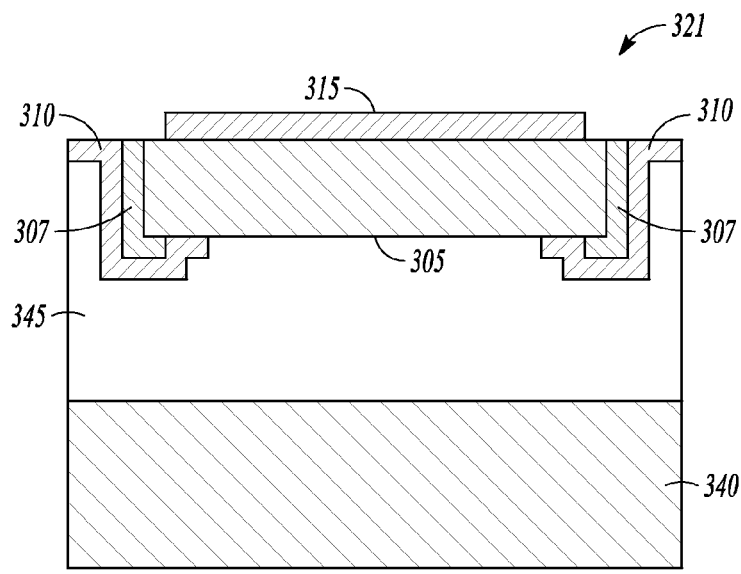

FIG. 3G shows a cross-sectional view of a photosensitive pixel being constructed using second constructed wafer 321 after forming a conductive plane 315 on photodetection region 305. Conductive plane 315 provides the respective photosensitive pixel with an electrical contact to couple to an external structure. Conductive plane 315 is disposed opposite the surface that will provide the optical aperture.

Handle wafer 340 can be used to attach the pixels of the constructed focal plane arrays to control circuits on another wafer. The attachment may be realized by contacting the pixels of the constructed focal plane arrays to corresponding bumps disposed on conductive bonding pads of the control circuits on the other wafer. Such attachment can be performed using flip-chip bonding techniques. Alternatively, handle wafer 340 and temporary bond polymer 345 with attached focal plane arrays can be diced into individual dies that are then attached to its corresponding control circuit die followed by removal of handle wafer material and temporary bond polymer material. After bonding second wafer 321 to the wafer having the control circuits, via a solder bump using handle wafer 340, underfill epoxy can be placed between the second wafer 321 and the wafer having the control circuits. Though it is not always necessary to include the underfill epoxy, inclusion this epoxy adds some mechanical stability.

Figure 3H:
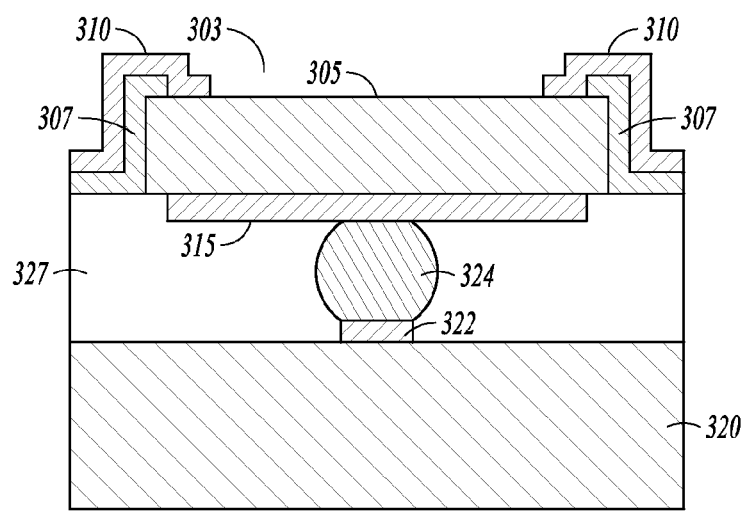

FIG. 3H shows a cross-sectional view of a pixel of a focal plane array coupled to control circuit 320 after handle wafer 340 and temporary bond polymer 345 are removed. Different processes can be used to remove handle wafer 340 including mechanical polishing. There are also a number of techniques to remove temporary bond polymer 345. For example, a selective polymer solvent can be used based on the chemistry to generate the material of temporary bond polymer 345 such that the selective polymer solvent basically only reacts to the material of temporary bond polymer 345. A polymer for temporary bond polymer 345 can be used that becomes soft at higher temperatures allowing handle wafer 340 to slide off when temporary bond polymer 345 is heated to at least a threshold level. Another kind of polymer can be used between temporary bond polymer 345 and the structure composed of the focal plane arrays along with associated components, such that when this other polymer is exposed to ultraviolet (UV) radiation, it causes bubbles to form, where these bubbles cause the structure to basically pop off of the handle wafer 340/temporary bond polymer 345.

Removal of handle wafer 340 and temporary bond polymer 345 can be conducted on a wafer scale or on a die basis if the handle wafer 340 was previously diced to apply to a control circuit diced from the other wafer. Alternatively, temporary bond polymer 345 and/or the combination of handle wafer 340 and temporary bond polymer 345, or portions thereof, need not be removed if handle wafer 340 and temporary bond polymer 345 are transparent to incident radiation in a wavelength range determined by the photodetector of photodetection region 305.

The use of handle wafer 340 and temporary bond polymer 345 arranges photodetection region 305 with optical aperture 303 provided by contact plane 310 and with electrical contact to a control circuit 320 provided by conductive plane 315 contacting bump 324 disposed on and contacting conductive bonding pad 322 of control circuit 320, where an optional underfill epoxy 327 can be included. Correlations between components of pixel 202 of FIG. 2 with the structures shown in FIGS. 3A-3H can be seen from comparing these figures and from the discussions herein.

Applying processing features similar to or identical to the features of FIGS. 3A-3H can provide for wafer level substrate removal along with enhanced pixel structure. The resulting pixel can be resilient against thermo cycling, have increased optical isolation, and thin semiconductor contact layers.

Figure 4:
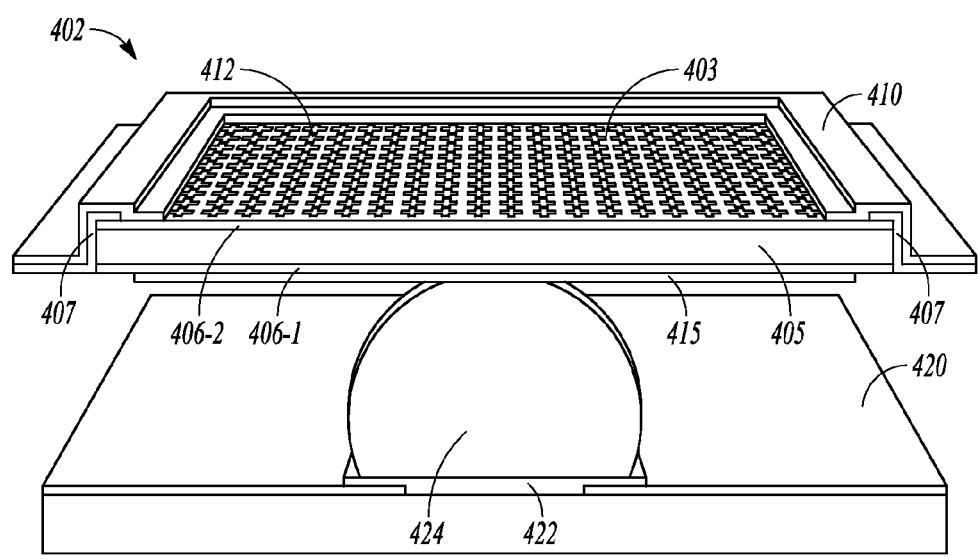
FIG. 4 is a representation of another example architecture of a pixel of a focal plane array, in accordance with various embodiments.

FIG. 4 is a representation of an embodiment of another example architecture of a pixel 402 of a focal plane array. Pixel 402 is a photosensitive pixel, which can be fabricated using wafer level integration. Pixel 402 comprises photodetector 405, an electrical contact 415, and a contact plane 410 with an optical aperture 403 to the photodetector 405. Contact plane 410 can be a flexible, highly conductive layer, which flexible, highly conductive layer can be realized by flexible metals, flexible metal composites, and flexible metallic-like materials that can include conductive polymers and conductive oxides, among others. Contact plane 410 can be conductively coupled to photodetector 405 and disposed on photodetector 405 such that arrangement of contact plane 410 provides optical aperture 403 to the photodetector 405. Photodetector 405 can be conductively coupled to electrical contact 415, and electrical contact 415 can be arranged to couple to a device or circuit external to the focal plane array. For example, the external device or circuit can be a read-out integrated circuit (ROIC) 420. Pixel 402 also comprises a frequency selective surface 412, shown as a grid in FIG. 4, disposed on photodetector 405 within optical aperture 403 formed by the arrangement of contact plane 410. Frequency selective surface 412 is not limited to a grid pattern of rows and columns, but can be arranged in other shapes according to the application to which the focal plane array is designed and constructed. Frequency selective surface 412 provides a mechanism to aid coupling of incoming radiation into a photodetector 405. Arranging frequency selective surface 412 as a high resolution frequency selective surface can increase the signal-to-noise associate with pixel 402.

If contact plane 410 is formed on a portion of the top of photodetector 405 and along the sides of photodetector 405, contact plane 410 can be separated from the sides of photodetector 405 by a dielectric material, which is an electrical insulator 407. Photodetector 405 can include contact layers 406-1 and 406-2 of doped semiconductor material. Alternatively, contact layers 406-1 and 406-2 may be limited to regions contacting contact plane 410. With contact layers 406-1 and 406-2 limited to regions contacting contact plane 410, contact layers 406-1 and 406-2 may be ohmic contacts depending on the type of detector used for photodetector 405. Photodetector 405 can be structured with a thin active region that reduces dark current and reduces associated molecular beam epitaxy (MBE) grow time of photodetector 405.

Pixel 402 of the FPA is one of a number of photosensitive pixels. Pixels 402 can be arranged in a format of rows and columns. Other arrangements of pixels 402 can be formed for the focal plane array. Each pixel of the FPA can be structured substantially the same, such that each pixel 402 is a unit cell of the FPA. Contact plane 410 can provide optical isolation between unit cells. Contact plane 410 can be arranged as a metallic ground plane for the unit cells of the FPA. Contact plane 410 of each photosensitive pixel can be common to the other photosensitive pixels of the focal plane array. Contact plane 410 can be disposed on edges of the photodetector 405 such that arrangement of contact plane 410 on the edges provides optical aperture 403 to photodetector 405. Contact plane 410 can extend inward from the edges to a selected distance depending on the architecture being processed.

As noted, ground plane 410 can be composed of metallic-like material that provides flexibility. Besides flexible metals and metal composites, flexible metallic-like materials can include conductive polymers and conductive oxides, among others. Electrical contact 415 may also use metallic-like material. Electrical contact 415 may be composed of the same material as that of metallic ground plane 410 or of another metallic-like material that provides flexibility. Use of such material for ground plane 410 can provide a FPA with increased thermal cycle lifetime as compared to using a semiconductor ground plane.

Pixel 402 of focal plane array can be bonded to ROIC 420. ROIC 420 can be bonded to the focal plane array with a conductive bonding pad 422 conductively coupled to electrical contact 415 of each respective photosensitive pixel 402. The conductive coupling can be realized using a conductive interconnect such as, but not limited to, a solder bump 424 such as used in flip-chip bonding. Bump 424 can be an indium bump. Each pixel of the focal plane array may be bonded in the same manner to ROIC 420.

In addition to enhancements associated with other architectures discussed herein, the structure of pixel 402 can provide a high resolution pattern of a frequency selective surface. This high resolution pattern may result from wafer level frequency selective surface patterning. Photodetector 405 may be a photodetector with thickness reduced from conventional photodetectors of FPA pixels, where the architecture of pixel 402 provides for MBE grow time of detector 405 reduced from the time associated with conventional photodetectors of FPA pixels. The architecture of pixel 602 may also provide increased signal to noise ratio relative to pixels of conventional FPAs. Photodetectors coupled with ohmic contacts to contact plane 410 may attain low electromagnetic losses. In a non-limiting example, with type II strained layer superlattice (SLS) and mercury cadmium telluride (MCT) photodetectors used for photodetector 405 and gold (Au) ohmic contacts to metal ground plane 410, low electromagnetic metal losses may be attained.

Figure 5A:
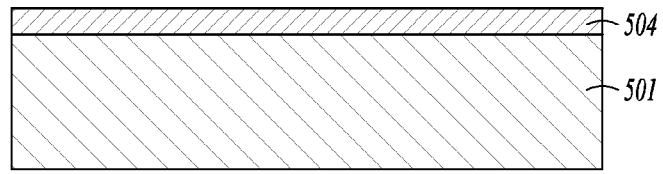
FIGS. 5A-5I show features of an example method of fabricating focal plane arrays, in accordance with various embodiments.
Figure 5B:
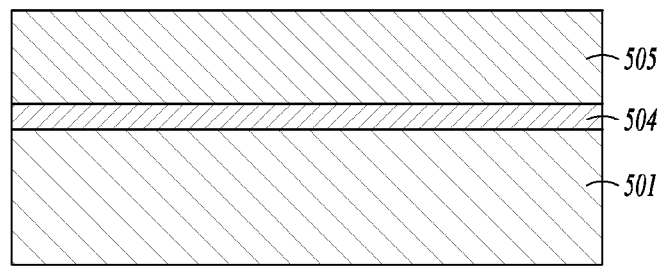

FIGS. 5A-5I show features of an embodiment of a method of fabricating focal plane arrays. Each focal plane array has an array of photosensitive pixels. This method can be used to fabricate the pixels of the focal plane array represented in FIG. 4. Processing as shown in FIGS. 5A-5I provides a mechanism to fabricate focal plane arrays and apply these focal plane arrays to control circuits on a wafer level. FIG. 5A is a representation of a substrate 501 after an etch stop layer 504 has been applied to substrate 501. A photodetection region 505 can be formed on etch stop layer 504. Photodetection region 505 can include a semiconductor-based photodetector having an active region and outer layers doped to provide contacts to the active region. One of the outer layers can contact etch stop layer 504 and another outer layer can be disposed at the surface region of photodetection region 505, opposite etch stop layer 504. FIG. 5B is a representation of photodetection region 505 disposed on etch stop layer 504 on substrate 501 after photodetection region 505 has been formed.

Figure 5C:
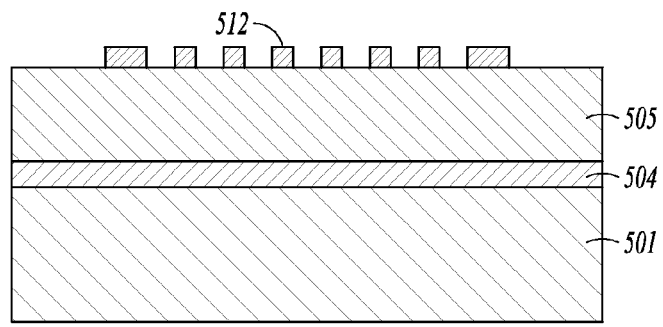

FIG. 5C is a cross-sectional view showing a frequency selective surface 512 formed photodetection region 505 that has been formed on etch stop layer 504 on substrate 501. Frequency selective surface 512 can be formed as an array or grid of metallic material on photodetection region 505. Frequency selective surface 512 is not limited to a grid pattern of rows and columns, but can be arranged in other shapes according to the application to which the focal plane array is designed and constructed.

Figure 5D:
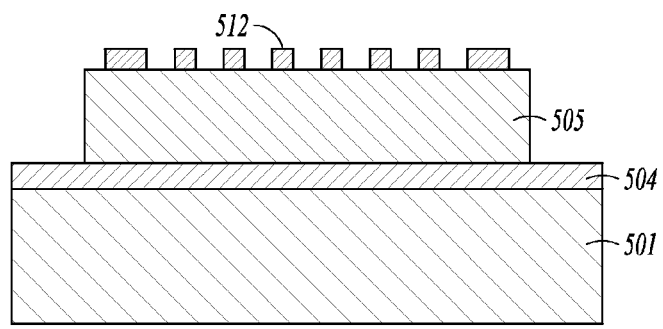

FIG. 5D is a cross-sectional view showing photodetection region 505, with frequency selective surface 512 thereon, on etch stop layer 504 on substrate 501 after processing to etch photodetection region 505 to provide photodetection regions with associated frequency selective surface for each pixel of the focal plane arrays being fabricated. The etch provides mesa 505 as a photodetection region for a pixel. Alternatively, the active regions and contacts of photodetection region 505 along with frequency selective surface 512 can be formed after mesa etch of layers provided to form photodetection region 505.

Figure 5E:
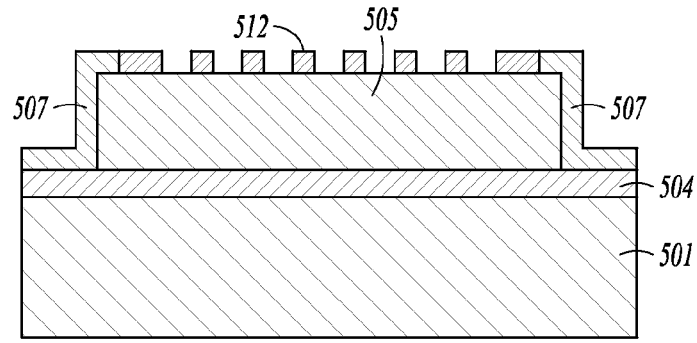

FIG. 5E is a cross-sectional view showing electrically insulating material 507 formed on the sides of photodetection region 505. Electrically insulating material 507 can be a passivation layer. Electrically insulating material 507 can extend from a top surface of photodetection region 505 to etch stop layer 504. Electrically insulating material 507 may be disposed to extend from an end of the top surface of photodetection region 505 inwards along the top surface. Electrically insulating material 507 may extend inwards along the top surface to contact ends of frequency selective surface 512. Electrically insulating material 507 may be disposed to extend from an end of the sides of photodetection region 505 outward along etch stop layer 504.

Figure 5F:
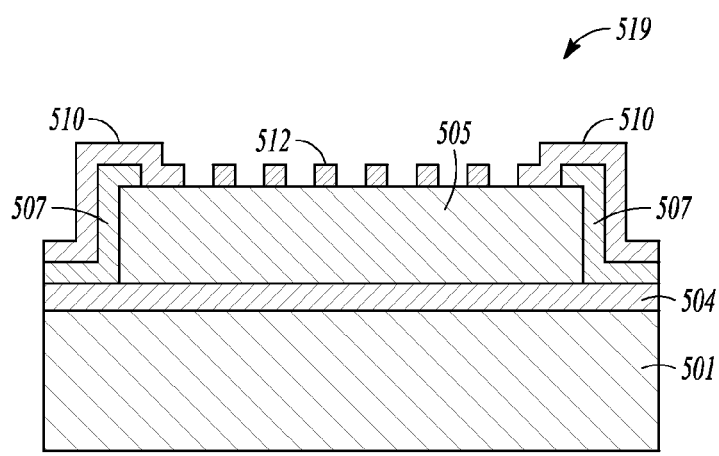

FIG. 5F is a cross-sectional view showing a contact plane 510 formed on photodetection region 505. Contact plane 510 can be formed using a highly conductive metallic-like material that provides flexibility. Besides flexible metals and metal composites, flexible metallic-like materials can include conductive polymers and conductive oxides. In each focal plane array of the wafer being processed, contact plane 510 may be formed with respect to the pixels of a focal plane array to provide a common ground metal. Contact plane 510 can be formed to cover electrically insulating material 507 adjacent photodetection region 505, extending from electrically insulating material 507 on the top surface of photodetection region 505 to contact photodetection region 505. Contact plane 510 can be formed to cover electrically insulating material 507 along sides of photodetection region 505, extending from the electrically insulating material 507 above the top surface of photodetection region 505 towards the portion of electrically insulating material 507 contacting etch stop 504.

Contact plane 510 is conductively coupled to the photodetector of photodetection region 505 and disposed onto and contacting photodetection region 505 such that arrangement of the contact plane 510 can provide an optical aperture to photodetection region 505 and hence to the photodetector of photodetection region 505. Frequency selective surface 512 is disposed on photodetection region 505 within the optical aperture. Contact plane 510 can be formed contacting frequency selective surface 512. As can be seen in FIG. 5F, contact plane 510 can be disposed on edges of photodetection region 505 such that arrangement of the contact plane on the edges can provide the optical aperture to photodetection region 505 including frequency selective surface 512 disposed within the optical aperture. At this stage of processing, photodetection region 505 is disposed on etch stop layer 504 on substrate 501 providing a first constructed wafer 519.

A handle wafer can be attached to the first constructed wafer 519 of FIG. 5F. The handle wafer can be used to remove substrate 501 and etch stop layer 504. Removal of substrate 501 may be processed by mechanically polishing down to etch stop layer 504 with chemical etching to remove residual material of substrate 501. Chemicals can be applied to selectively remove etch top layer 504. Other removal techniques can be used such as by epitaxial liftoff. By using a handle wafer, substrate 501 can be removed from all focal plane array dies simultaneously.

Figure 5G:
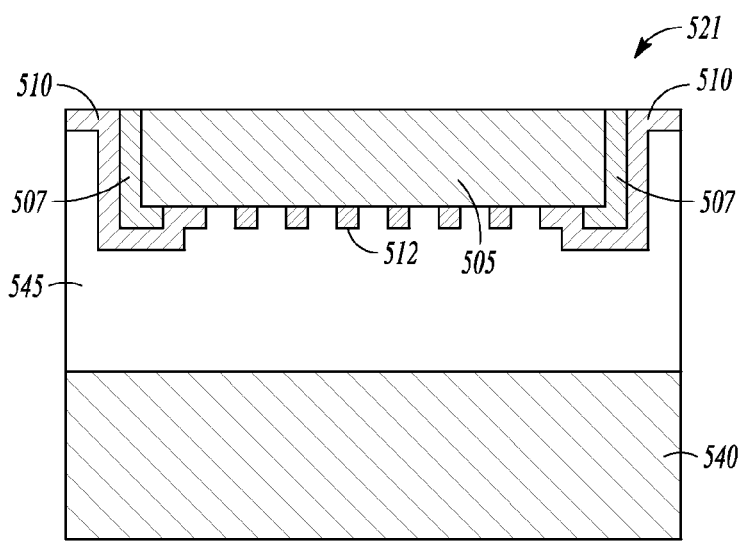

FIG. 5G shows a cross-sectional view of the first constructed wafer 519 after substrate 501 and etch stop layer 504 have been removed providing a second constructed wafer 521. Second constructed wafer 521 includes focal plane arrays having pixels, being formed, coupled to a handle wafer 540. Handle wafer 540 can be attached using a temporary bond polymer 545, where temporary bond polymer 545 separates the pixels being constructed from handle wafer 540. Temporary bond polymer 545 can be spin coated on one or both of constructed wafer 519 and handle wafer 540 with heat and pressure applied to accomplish the attachment or bonding. Room temperature processing of the attachment or bonding may be realized with temporary bond polymer 545 having appropriate viscosity.

Figure 5H:
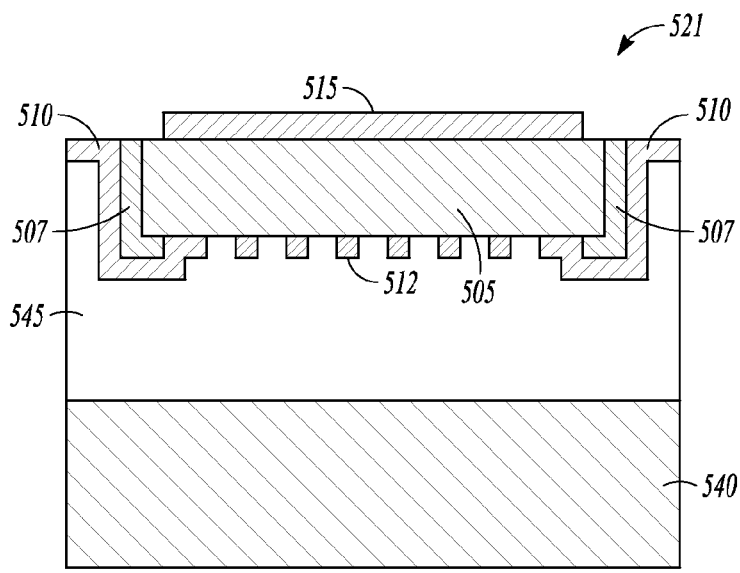

FIG. 5H shows a cross-sectional view of a photosensitive pixel being constructed using second constructed wafer 521 after forming a conductive plane 515 on photodetection region 505. Conductive plane 515 provides the respective photosensitive pixel with an electrical contact to couple to an external structure. Conductive plane 515 is disposed opposite the surface that will provide the optical aperture.

Handle wafer 540 can be used to attach the pixels of the constructed focal plane arrays to control circuits on another wafer. The attachment may be realized by contacting the pixels of the constructed focal plane arrays to corresponding bumps disposed on conductive bonding pads of the control circuits on the other wafer. Such attachment can be performed using flip-chip bonding techniques. Alternatively, handle wafer 540 and temporary bond polymer 545 with attached focal plane arrays can be diced into individual dies that are then attached to its corresponding control circuit die followed by removal of handle wafer material and temporary bond polymer material. After bonding second wafer 521 to the wafer having the control circuits, via a solder bump using handle wafer 540, underfill epoxy can be placed between the second wafer 521 and the wafer having the control circuits. Though it is not always necessary to include the underfill epoxy, inclusion this epoxy adds some mechanical stability.

Figure 5I:
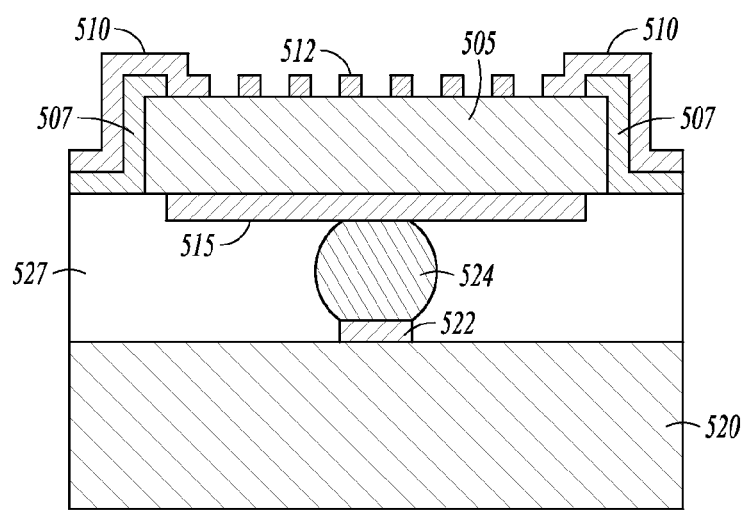

FIG. 5I shows a cross-sectional view of a pixel of a focal plane array coupled to control circuit 520 after handle wafer 540 and temporary bond polymer 545 are removed. Different processes can be used to remove handle wafer 540 including mechanical polishing. There are also a number of techniques to remove temporary bond polymer 545. For example, a selective polymer solvent can be used based on the chemistry to generate the material of temporary bond polymer 545 such that the selective polymer solvent basically only reacts to the material of temporary bond polymer 545. A polymer for temporary bond polymer 545 can be used that becomes soft at higher temperatures allowing handle wafer 540 to slide off when temporary bond polymer 545 is heated to at least a threshold level. Another kind of polymer can be used between temporary bond polymer 545 and the structure composed of the focal plane arrays along with associated components, such that when this other polymer is exposed to ultraviolet (UV) radiation, it causes bubbles to form, where these bubbles cause the structure to basically pop off of the handle wafer 540/temporary bond polymer 545.

Removal of handle wafer 540 and temporary bond polymer 545 can be conducted on a wafer scale or on a die basis if the handle wafer 540 was previously diced to apply to a control circuit diced from the other wafer. Alternatively, temporary bond polymer 545 and/or the combination of handle wafer 540 and temporary bond polymer 545, or portions thereof, need not be removed if handle wafer 540 and temporary bond polymer 545 are transparent to incident radiation in a wavelength range determined by the photodetector of photodetection region 505.

The use of handle wafer 540 and temporary bond polymer 545 arranges photodetection region 505 with optical aperture 503 provided by contact plane 510, with a frequency selective surface 512 within optical aperture 503, and with electrical contact to a control circuit 520 provided by conductive plane 515 contacting bump 524 disposed on and contacting conductive bonding pad 522 of control circuit 520, where an optional underfill epoxy 527 can be included. Correlations between components of pixel 402 of FIG. 4 with the structures shown in FIGS. 5A-5I can be seen from comparing these figures and from the discussions herein.

Figure 6:
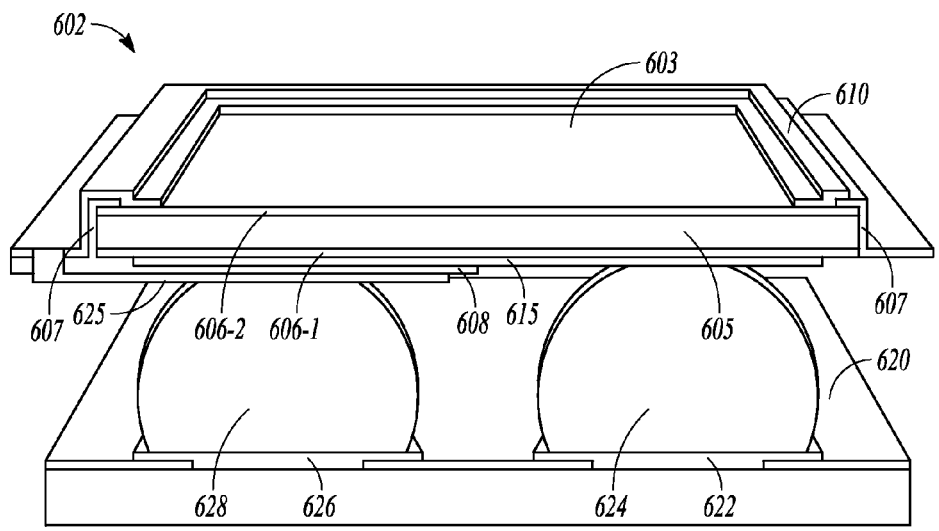
FIG. 6 is a representation of another example architecture of a pixel of a focal plane array, in accordance with various embodiments.

FIG. 6 is a representation of an embodiment of another example architecture of a pixel 602 of a focal plane array. Pixel 602 is a photosensitive pixel, which can be fabricated using wafer level integration. Pixel 602 comprises photodetector 605, an electrical contact 615, and a contact plane 610 with an optical aperture 603 to the photodetector 605. Contact plane 610 can be a flexible, highly conductive layer, which flexible, highly conductive layer can be realized by flexible metals, flexible metal composites, and flexible metallic-like materials that can include conductive polymers and conductive oxides, among others. Contact plane 610 can be conductively coupled to photodetector 605 and disposed on photodetector 605 such that arrangement of contact plane 610 provides an optical aperture 603 to photodetector 605.

Photodetector 605 can be conductively coupled to electrical contact 615, and electrical contact 615 can be arranged to couple to a device or circuit external to the focal plane array. For example, the external device or circuit can be a read-out integrated circuit (ROIC) 620. Pixel 602 also comprises a bottom contact 625 to couple to the device or circuit external to the focal plane array, such as a ROIC, on the same side of photodetector 605 that electrical contact 615 is arranged to couple to the device or circuit external to the focal plane array. Bottom contact 615 can be electrically coupled to the contact plane 610 by the bottom contact 625 extending from the bottom region of the photodetector 605 upwards to the contact plane 610. On the same side of the photodetector 605, bottom contact 625 electrical contact 615 can be separated by electrically insulating region 608.

If contact plane 610 is formed on a portion of the top of photodetector 605 and along the sides of photodetector 605, contact plane 610 can be separated from the sides of photodetector 605 by a dielectric material, which is an electrical insulator 607. The photodetector 605 can include contact layers 606-1 and 606-2 of doped semiconductor material. Alternatively, contact layers 606-1 and 606-2 may be limited to regions contacting contact plane 610. With contact layers 606-1 and 606-2 limited to regions contacting contact plane 610, contact layers 606-1 and 606-2 may be ohmic contacts depending on the type of detector used for photodetector 605.

Pixel 602 of the FPA is one of a number of photosensitive pixels. The pixels can be arranged in a format of rows and columns. Other arrangements of pixels 602 can be formed for the focal plane array. Each pixel of the FPA can be structured substantially the same, such that each pixel 602 is a unit cell of the FPA. Contact plane 610 can provide optical isolation between unit cells. Contact plane 610 can be arranged as a metallic ground plane for the unit cells of the FPA. Contact plane 610 of each photosensitive pixel can be common to the other photosensitive pixels of the focal plane array. Contact plane 610 can be disposed on edges of the photodetector 605 such that arrangement of contact plane 610 on the edges provides the optical aperture 603 to the photodetector 605. Contact plane 610 can extend inward from the edges to a selected distance depending on the architecture being processed.

As noted, ground plane 610 can be composed of metallic-like material that provides flexibility. Besides flexible metals and metal composites, flexible metallic-like materials can include conductive polymers and conductive oxides, among others. Electrical contact 615 may also use metallic-like material. Electrical contact 215 may be composed of the same material as that of metallic ground plane 610 or of another metallic-like material that provides flexibility. Use of such material for ground plane 610 can provide a FPA with increased thermal cycle lifetime as compared to using a semiconductor ground plane.

The respective photosensitive pixel 602 of the focal plane array can be bonded to the device or circuit external to the focal plane array, such as ROIC 620, with a conductive bonding pad 622 conductively coupled to the electrical contact 615 of the respective photosensitive pixel 602 and with another conductive bonding pad 626 conductively coupled to the bottom contact 625. The conductive coupling can be realized using a conductive interconnect such as, but not limited to, a solder bumps 624 and 628 such as used in flip-chip bonding.

The bumps 624, 628 can be an indium bumps. Each pixel of the focal plane array may be bonded in the same manner to the device or circuit external to the focal plane array, such as ROIC 620.

In addition to enhancements associated with other architectures discussed herein, the structure of pixel 602 can provide full single photodetector control. For example, the structure of pixel 602 can provide full single photodetector control. The structure of pixel 602 allows access to single pixel top and bottom contacts from the bottom side of pixel 602 connectable to a circuit external to the focal plane array. The structure of pixel 602 can provide complete electrical isolation from neighbor unit cells. The architecture of pixel 602 may also provide low noise voltage and/or current measurement for a single pixel.

Figure 7A:
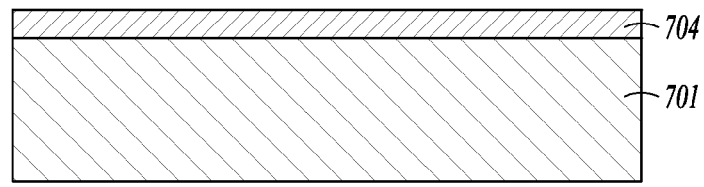
FIGS. 7A-7J show features of an example method of fabricating focal plane arrays, in accordance with various embodiments.
Figure 7B:
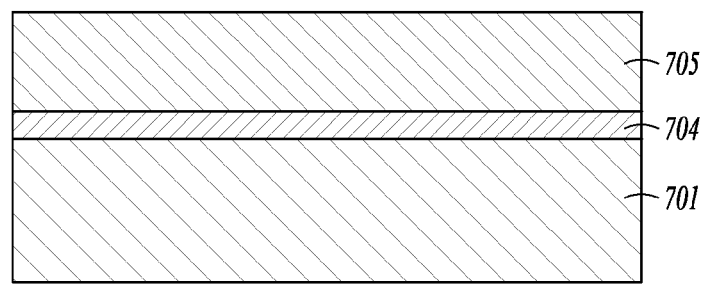

FIGS. 7A-7J show features of an embodiment of a method of fabricating focal plane arrays. Each focal plane array has an array of photosensitive pixels. This method can be used to fabricate the pixels of the focal plane array represented in FIG. 6. Processing as shown in FIGS. 7A-7J provides a mechanism to fabricate focal plane arrays and apply these focal plane arrays to control circuits on a wafer level. FIG. 7A is a representation of a substrate 701 after an etch stop layer 704 has been applied to substrate 701. A photodetector region 705 can be formed on etch stop layer 704. Photodetection region 705 can include a semiconductor-based photodetector having an active region and outer layers doped to provide contacts to the active region. One of the outer layers can contact etch stop layer 704 and another outer layer can be disposed at the surface region of photodetection region 705, opposite etch stop layer 704. FIG. 7B is a representation of photodetection region 705 disposed on etch stop layer 704 on substrate 701 after photodetection region 705 has been formed.

Figure 7C:
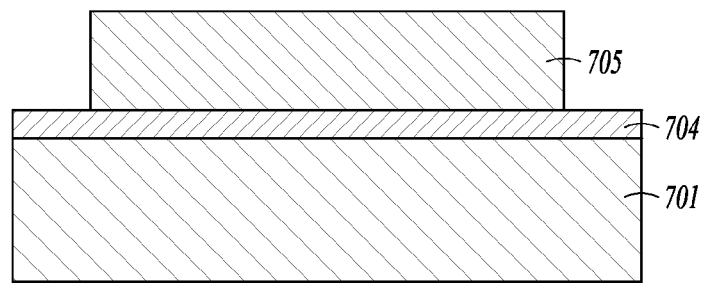

FIG. 7C is a cross-sectional view showing photodetection region 705 on etch stop layer 704 on substrate 701 after processing to etch photodetection region 705 to provide photodetection regions for each pixel of the focal plane arrays being fabricated. The etch provides mesa 705 as a photodetection region for a pixel. Alternatively, the active regions and contacts of photodetection region 705 can be formed after mesa etch of layers provided to form photodetection region 705.

Figure 7D:
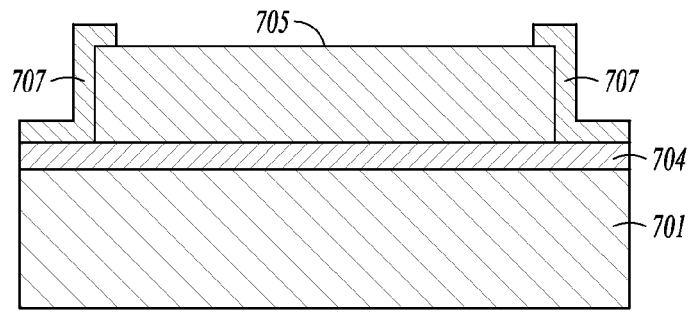

FIG. 7D is a cross-sectional view showing electrically insulating material 707 formed on the sides of photodetection region 705. Electrically insulating material 707 can be a passivation layer. Electrically insulating material 707 can extend from a top surface of photodetection region 705 to etch stop layer 704. Electrically insulating material 707 may be disposed to extend from an end of the top surface of photodetection region 705 inwards along the top surface. Electrically insulating material 707 may be disposed to extend from an end of the sides of photodetection region 705 outward along etch stop layer 704.

Figure 7E:
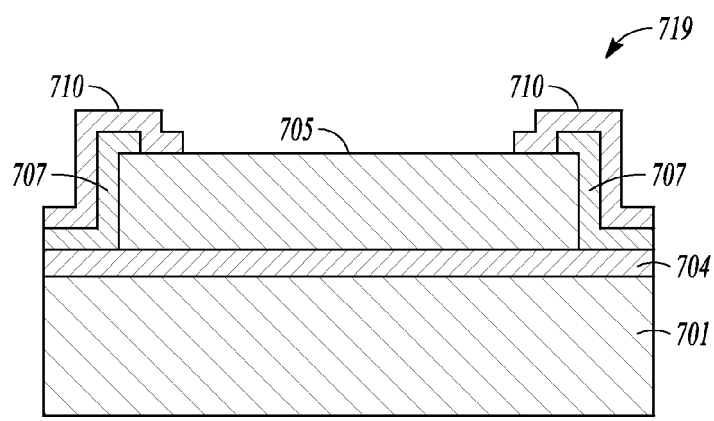

FIG. 7E is a cross-sectional view showing a contact plane 710 formed on photodetection region 705. Contact plane 710 can be formed using a highly conductive metallic-like material that provides flexibility. Besides flexible metals and metal composites, flexible metallic-like materials can include conductive polymers and conductive oxides. In each focal plane array of the wafer being processed, contact plane 710 may be formed with respect to the pixels of a focal plane array to provide a common ground metal. Contact plane 710 can be formed to cover electrically insulating material 707 adjacent photodetection region 705, extending from electrically insulating material 707 on the top surface of photodetection region 705 to contact photodetection region 705. Contact plane 710 can be formed to cover electrically insulating material 707 along sides of photodetection region 705, extending from the electrically insulating material 707 above the top surface of photodetection region 705 towards the portion of electrically insulating material 707 contacting etch stop 704.

Contact plane 710 is conductively coupled to the photodetector of photodetection region 705 and disposed onto and contacting photodetection region 705 such that arrangement of the contact plane 710 can provide an optical aperture to photodetection region 705 and hence to the photodetector of photodetection region 705. As can be seen in FIG. 7E, contact plane 710 can be disposed on edges of photodetection region 705 such that arrangement of the contact plane on the edges can provide the optical aperture to photodetection region 705. At this stage of processing, photodetection region 705 is disposed on etch stop layer 704 on substrate 701 providing a first constructed wafer 719.

A handle wafer can be attached to the first constructed wafer 719 of FIG. 7E. The handle wafer can be used to remove substrate 701 and etch stop layer 704. Removal of substrate 701 may be processed by mechanically polishing down to etch stop layer 704 with chemical etching to remove residual material of substrate 701. Chemicals can be applied to selectively remove etch top layer 704. Other removal techniques can be used such as by epitaxial liftoff. By using a handle wafer, substrate 701 can be removed from all focal plane array dies simultaneously.

Figure 7F:
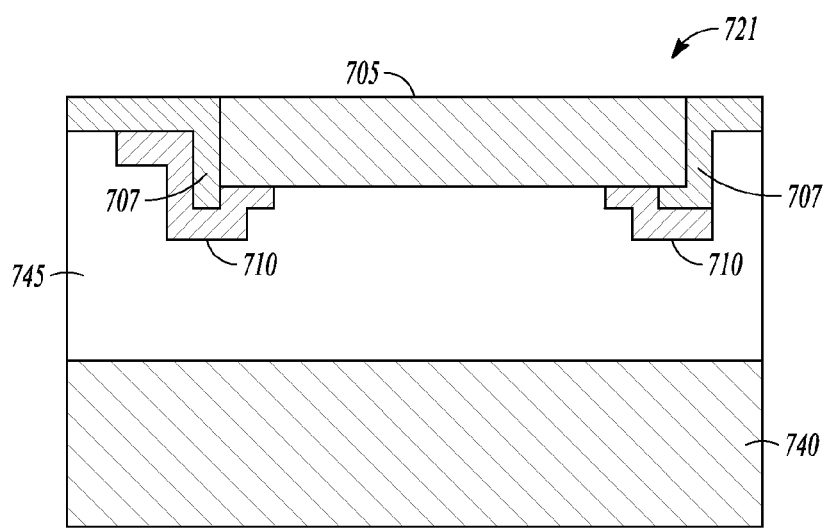

FIG. 7F shows a cross-sectional view of the first constructed wafer 719 after substrate 701 and etch stop layer 704 have been removed providing a second constructed wafer 721. Second constructed wafer 721 includes focal plane arrays having pixels, being formed, coupled to a handle wafer 740. Handle wafer 740 can be attached using a temporary bond polymer 745, where temporary bond polymer 745 separates the pixels being constructed from handle wafer 740. Temporary bond polymer 745 can be spin coated on one or both of constructed wafer 719 and handle wafer 740 with heat and pressure applied to accomplish the attachment or bonding. Room temperature processing of the attachment or bonding may be realized with temporary bond polymer 745 having appropriate viscosity.

Figure 7G:
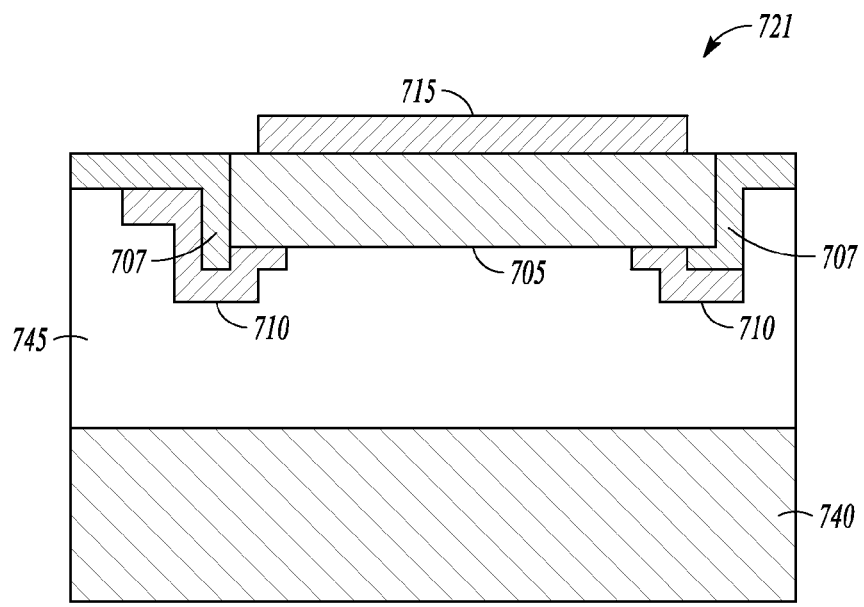

FIG. 7G shows a cross-sectional view of a photosensitive pixel being constructed using second constructed wafer 721 after forming a conductive plane 715 on photodetection region 705. Conductive plane 715 provides the respective photosensitive pixel with an electrical contact to couple to an external structure. Conductive plane 715 is disposed opposite the surface that will provide the optical aperture. With substrate 701 and etch stop layer 704 removed and with the focal plane arrays attached to handle wafer 740, the back side of the focal plane arrays, on which conductive plane 715 is disposed, can be further processed with additional structural features.

Figure 7H:
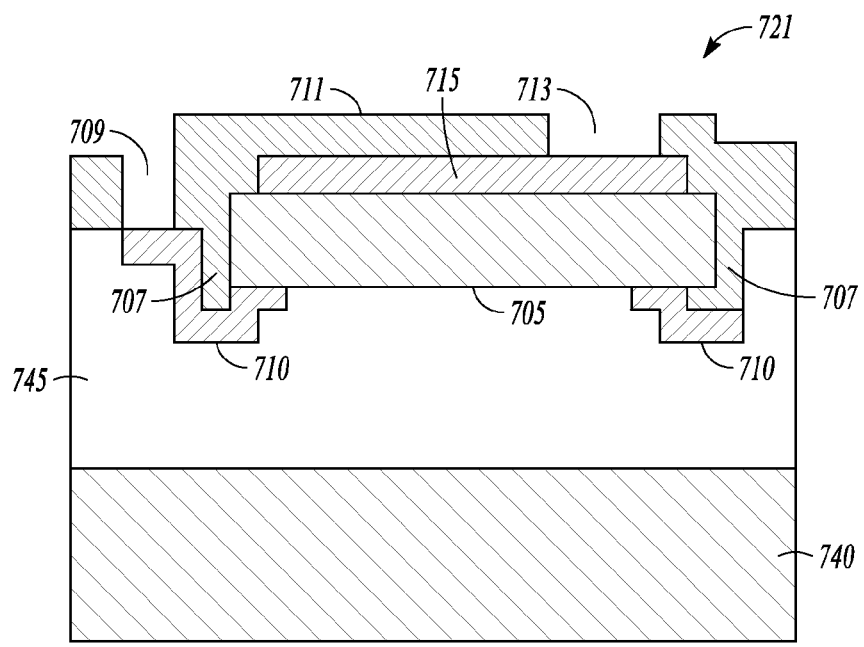

FIG. 7H shows a cross-sectional view of second constructed wafer 721 after additional processing. An electrically insulating material 711 is formed on electrically insulating material 707 and conductive plane 715. Electrically insulating material 711 is etched providing an opening 709 providing access to contact plane 710 and an opening 713 providing access to conductive plane 715.

Figure 7I:
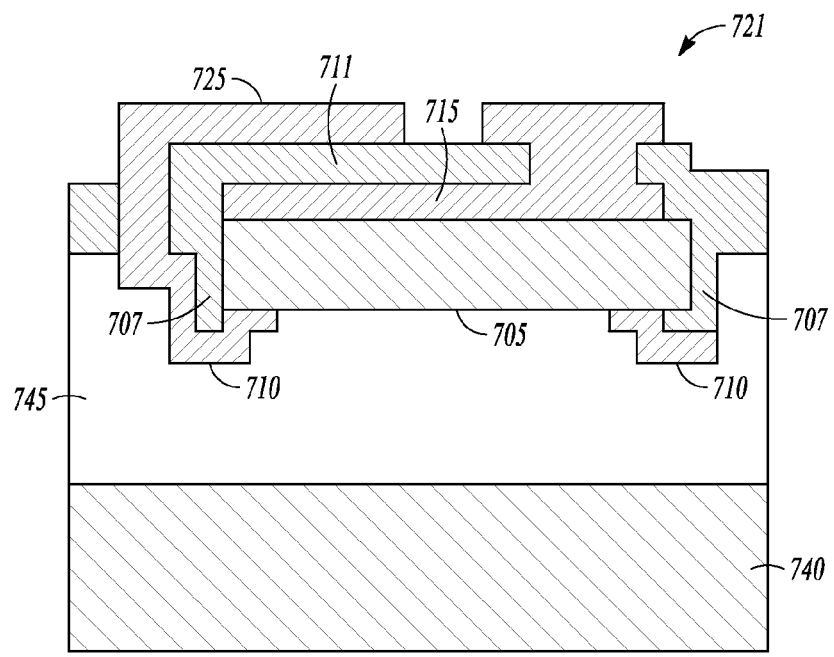

FIG. 7I shows a cross-sectional view of second constructed wafer 721 after additional processing following formation of electrically insulating material 711 and openings 709 and 713. Conductive material 725 is formed on electrically insulating material 711 and in opening 709 such that contact plane 710 connects to a portion of conductive material 725 disposed on electrically insulating material 711. Conductive material is formed in opening 713 on and contacting conductive plane 715 such that conductive plane 715 extends onto electrically insulating material 711. The portion of conductive plane 715 that extends onto electrically insulating material 711 is spaced apart from the portion of conductive material 725 on electrically insulating material 711, such that conductive plane 715 remains electrically separated from contact plane 710. Alternatively, opening 713 remains open and can be used as a pathway for a connector to a control circuit to electrically connect to conductive plane 715. See bump 724 of FIG. 7G that can be shaped to be disposed in opening 713 to contact conductive plane 715 when second constructed wafer 721 is mated to a wafer containing control circuits. Conductive material 725 and conductive material extending conductive plane 715 may be composed of material of contact plane 710, conductive plane 715, or other flexible conductive material.

Handle wafer 740 can be used to attach the pixels of the constructed focal plane arrays to control circuits on another wafer. The attachment may be realized by contacting the pixels of the constructed focal plane arrays to corresponding bumps disposed on conductive bonding pads of the control circuits on the other wafer. Such attachment can be performed using flip-chip bonding techniques. Alternatively, handle wafer 740 and temporary bond polymer 745 with attached focal plane arrays can be diced into individual dies that are then attached to its corresponding control circuit die followed by removal of handle wafer material and temporary bond polymer material. After bonding second wafer 721 to the wafer having the control circuits, via a solder bump using handle wafer 740, underfill epoxy can be placed between the second wafer 721 and the wafer having the control circuits. Though it is not always necessary to include the underfill epoxy, inclusion this epoxy adds some mechanical stability.

Figure 7J:
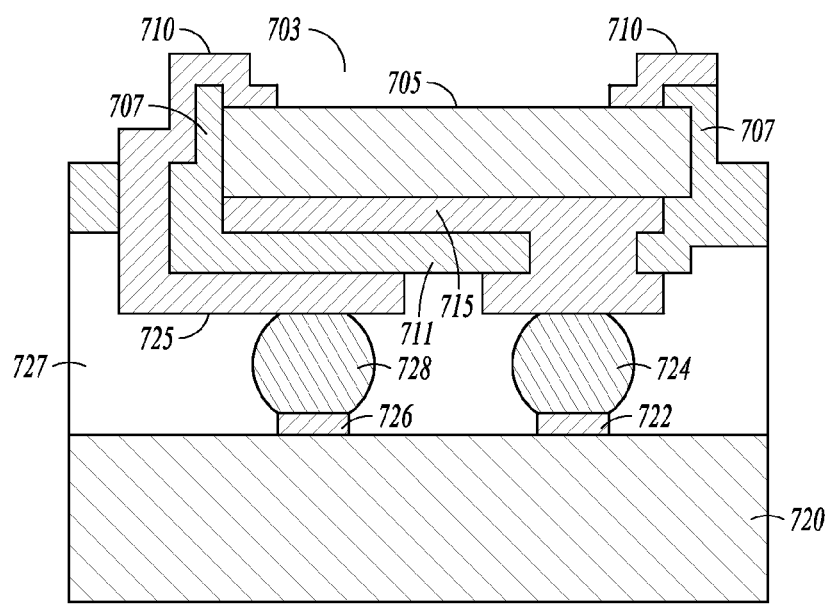

FIG. 7J shows a cross-sectional view of a pixel of a focal plane array coupled to control circuit 720 after handle wafer 740 and temporary bond polymer 745 are removed. Different processes can be used to remove handle wafer 740 including mechanical polishing. There are also a number of techniques to remove temporary bond polymer 745. For example, a selective polymer solvent can be used based on the chemistry to generate the material of temporary bond polymer 745 such that the selective polymer solvent basically only reacts to the material of temporary bond polymer 745. A polymer for temporary bond polymer 745 can be used that becomes soft at higher temperatures allowing handle wafer 740 to slide off when temporary bond polymer 745 is heated to at least a threshold level. Another kind of polymer can be used between temporary bond polymer 745 and the structure composed of the focal plane arrays along with associated components, such that when this other polymer is exposed to ultraviolet (UV) radiation, it causes bubbles to form, where these bubbles cause the structure to basically pop off of the handle wafer 740/temporary bond polymer 745.

Removal of handle wafer 740 and temporary bond polymer 745 can be conducted on a wafer scale or on a die basis if the handle wafer 740 was previously diced to apply to a control circuit diced from the other wafer. Alternatively, temporary bond polymer 745 and/or the combination of handle wafer 740 and temporary bond polymer 745, or portions thereof, need not be removed if handle wafer 740 and temporary bond polymer 745 are transparent to incident radiation in a wavelength range determined by the photodetector of photodetection region 705.

The use of handle wafer 740 and temporary bond polymer 745 arranges photodetection region 705 with optical aperture 703 provided by contact plane 710 and with electrical contacts to a control circuit 720. One of the electrical contacts is provided by conductive plane 715 contacting bump 724 disposed on and contacting conductive bonding pad 722 of control circuit 720. Another one of the electrical contacts is provided by conductive material 725 contacting bump 728 disposed on and contacting conductive bonding pad 724 of control circuit 720. An optional underfill epoxy 327 can be included. Correlations between components of pixel 602 of FIG. 6 with the structures shown in FIGS. 7A-7J can be seen from comparing these figures and from the discussions herein. The processing features of FIGS. 7A-7J provide a non-limiting example of additional processing available after substrate removal that can be attained with an architecture for a pixel of a focal plane array having a metal layer rather than a highly doped semiconductor ground plane.

Figure 8:
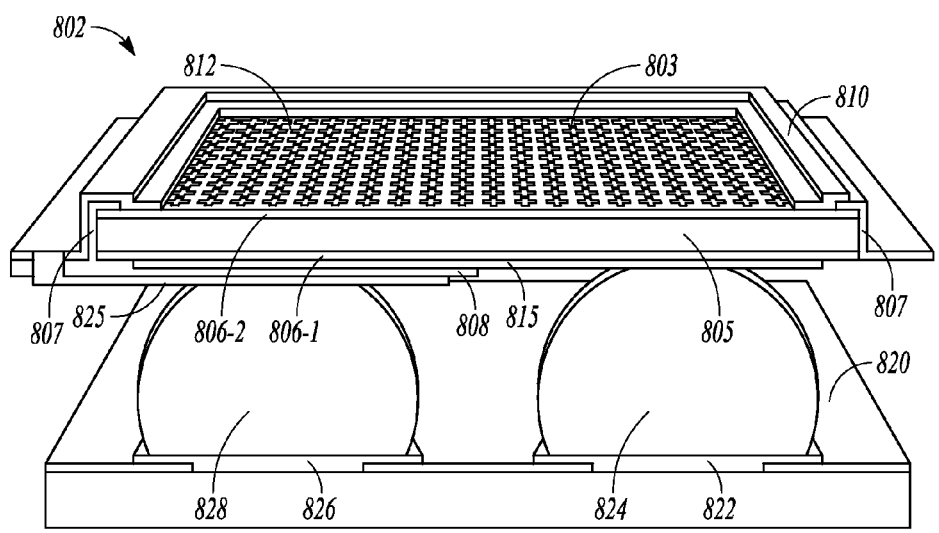
FIG. 8 is a representation of another example architecture of a pixel of a focal plane array, in accordance with various embodiments.

FIG. 8 is a representation of an embodiment of another example architecture of a pixel 802 of a focal plane array. Pixel 802 is a photosensitive pixel, which can be fabricated using wafer level integration. Pixel 802 comprises photodetector 805, an electrical contact 815, and a contact plane 810 with an optical aperture 803 to the photodetector 805. Contact plane 810 can be a flexible, highly conductive layer, which flexible, highly conductive layer can be realized by flexible metals, flexible metal composites, and flexible metallic-like materials that can include conductive polymers and conductive oxides, among others. Contact plane 810 can be conductively coupled to photodetector 805 and disposed on photodetector 805 such that arrangement of contact plane 810 provides an optical aperture 803 to photodetector 805.

Photodetector 805 can be conductively coupled to electrical contact 815, and electrical contact 815 can be arranged to couple to a device or circuit external to the focal plane array. For example, the external device or circuit can be a read-out integrated circuit (ROIC) 820. Pixel 802 also comprises a bottom contact 825 to couple to the device or circuit external to the focal plane array, such as a ROIC, on the same side of photodetector 805 that electrical contact 815 is arranged to couple to the device or circuit external to the focal plane array. Bottom contact 815 can be electrically coupled to contact plane 810 by bottom contact 825 extending from the bottom region of the photodetector 805 upwards to contact plane 810.

Pixel 802 also comprises a frequency selective surface 812, shown as a grid in FIG. 8, disposed on photodetector 805 within optical aperture 803 formed by the arrangement of contact plane 810. Frequency selective surface 812 is not limited to a grid pattern of rows and columns, but can be arranged in other shapes according to the application to which the focal plane array is designed and constructed. Frequency selective surface 812 provides a mechanism to aid coupling of incoming radiation into a photodetector 805.

If contact plane 810 is formed on a portion of the top of photodetector 805 and along the sides of photodetector 805, contact plane 810 can be separated from the sides of photodetector 805 by a dielectric material, which is an electrical insulator 807. Photodetector 805 can include contact layers 806-1 and 806-2 of doped semiconductor material. Alternatively, contact layers 806-1 and 806-2 may be limited to regions contacting contact plane 810. With contact layers 806-1 and 806-2 limited to regions contacting contact plane 810, contact layers 806-1 and 806-2 may be ohmic contacts depending on the type of detector used for photodetector 805.

Pixel 802 of the FPA is one of a number of photosensitive pixels. The pixels can be arranged in a format of rows and columns. Other arrangements of pixels 802 can be formed for the focal plane array. Each pixel of the FPA can be structured substantially the same, such that each pixel 802 is a unit cell of the FPA. Contact plane 810 can provide optical isolation between unit cells. Contact plane 810 can be arranged as a metallic ground plane for the unit cells of the FPA. Contact plane 810 of each photosensitive pixel can be common to the other photosensitive pixels of the focal plane array. Contact plane 810 can be disposed on edges of the photodetector 805 such that arrangement of the contact plane 810 on the edges provides optical aperture 803 to photodetector 805. Contact plane 810 can extend inward from the edges to a selected distance depending on the architecture being processed.

As noted, ground plane 810 can be composed of metallic-like material that provides flexibility. Besides flexible metals and metal composites, flexible metallic-like materials can include conductive polymers and conductive oxides, among others. Electrical contact 815 may also use metallic-like material. Electrical contact 815 may be composed of the same material as that of ground plane 810 or of another metallic-like material that provides flexibility. Use of such material for ground plane 810 can provide a FPA with increased thermal cycle lifetime as compared to using a semiconductor ground plane.

The respective photosensitive pixel 802 of the focal plane array can be bonded to the device or circuit external to the focal plane array, such as ROIC 820, with a conductive bonding pad 822 conductively coupled to electrical contact 815 of the respective photosensitive pixel 802 and with another conductive bonding pad 826 conductively coupled to bottom contact 825. The conductive coupling can be realized using a conductive interconnect such as, but not limited to, a solder bumps 824 and 828 such as used in flip-chip bonding. The bumps 824, 828 can be an indium bumps. Each pixel of the focal plane array may be bonded in the same manner to the device or circuit external to the focal plane array, such as ROIC 820.

Figure 9A:
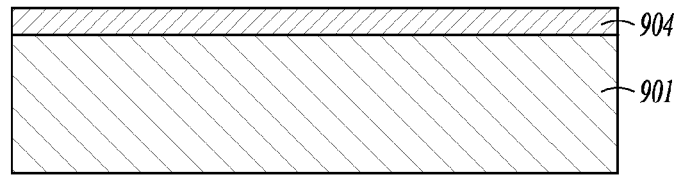
FIGS. 9A-9K show features of an example method of fabricating focal plane arrays, in accordance with various embodiments.
Figure 9B:
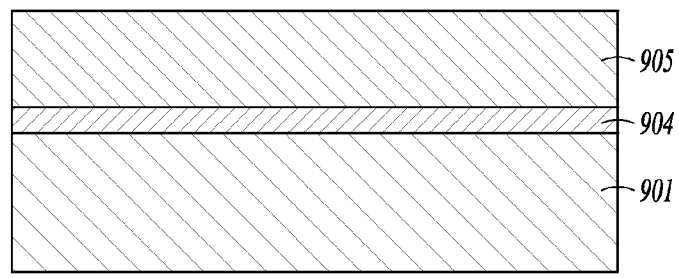

FIGS. 9A-9K show features of an embodiment of a method of fabricating focal plane arrays. Each focal plane array has an array of photosensitive pixels. This method can be used to fabricate the pixels of the focal plane array represented in FIG. 8. Processing as shown in FIGS. 9A-9K provides a mechanism to fabricate focal plane arrays and apply these focal plane arrays to control circuits on a wafer level. FIG. 9A is a representation of a substrate 901 after an etch stop layer 904 has been applied to substrate 901. A photodetection region 905 can be formed on etch stop layer 904. Photodetection region 905 can include a semiconductor-based photodetector having an active region and outer layers doped to provide contacts to the active region. One of the outer layers can contact etch stop layer 904 and another outer layer can be disposed at the surface region of photodetection region 905, opposite etch stop layer 904. FIG. 9B is a representation of photodetection region 905 disposed on etch stop layer 904 on substrate 901 after photodetection region 905 has been formed.

Figure 9C:
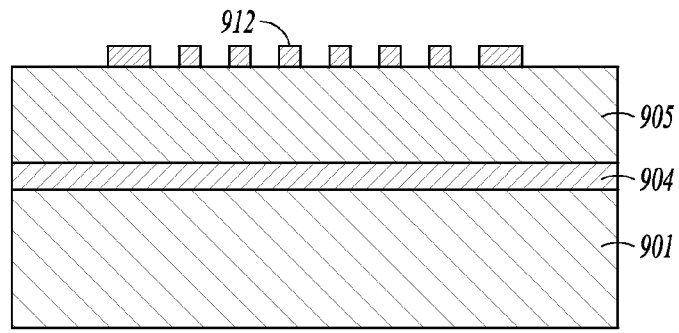

FIG. 9C is a cross-sectional view showing a frequency selective surface 912 formed photodetection region 905 that has been formed on etch stop layer 904 on substrate 901. Frequency selective surface 912 can be formed as an array or grid of metallic material on photodetection region 905. Frequency selective surface 912 is not limited to a grid pattern of rows and columns, but can be arranged in other shapes according to the application to which the focal plane array is designed and constructed.

Figure 9D:
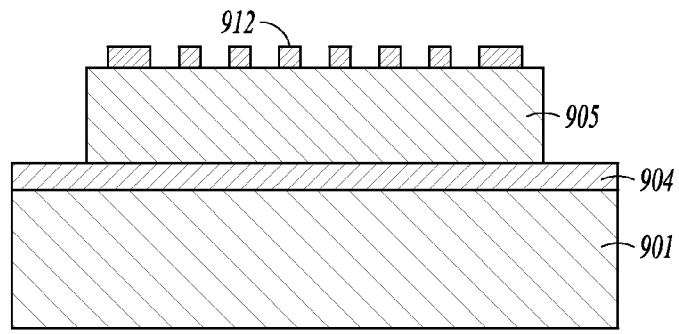

FIG. 9D is a cross-sectional view showing photodetection region 905, with frequency selective surface 912 thereon, on etch stop layer 904 on substrate 901 after processing to etch photodetection region 905 to provide photodetection regions with associated frequency selective surface for each pixel of the focal plane arrays being fabricated. The etch provides mesa 905 as a photodetection region for a pixel. Alternatively, the active regions and contacts of photodetection region 905 along with frequency selective surface 912 can be formed after mesa etch of layers provided to form photodetection region 905.

Figure 9E:
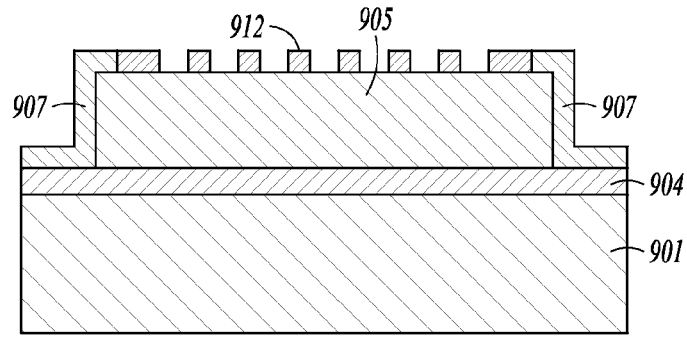

FIG. 9E is a cross-sectional view showing electrically insulating material 907 formed on the sides of photodetection region 905. Electrically insulating material 907 can be a passivation layer. Electrically insulating material 907 can extend from a top surface of photodetection region 905 to etch stop layer 904. Electrically insulating material 907 may be disposed to extend from an end of the top surface of photodetection region 905 inwards along the top surface. Electrically insulating material 907 may extend inwards along the top surface to contact ends of frequency selective surface 912. Electrically insulating material 907 may be disposed to extend from an end of the sides of photodetection region 905 outward along etch stop layer 904.

Figure 9F:
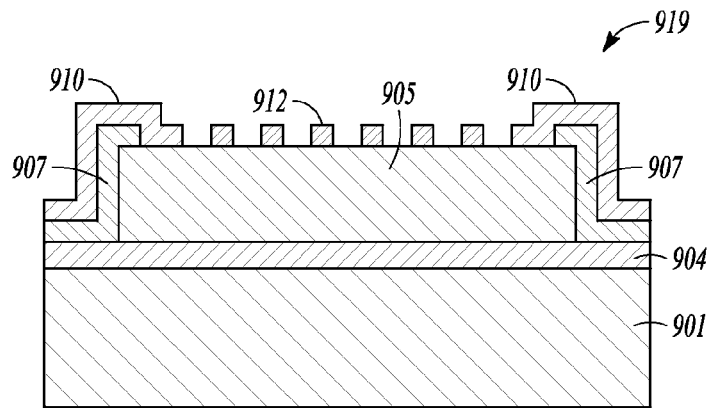

FIG. 9F is a cross-sectional view showing a contact plane 910 formed on photodetection region 905. Contact plane 910 can be formed using a highly conductive metallic-like material that provides flexibility. Besides flexible metals and metal composites, flexible metallic-like materials can include conductive polymers and conductive oxides. In each focal plane array of the wafer being processed, contact plane 910 may be formed with respect to the pixels of a focal plane array to provide a common ground metal. Contact plane 910 can be formed to cover electrically insulating material 907 adjacent photodetection region 905, extending from electrically insulating material 907 on the top surface of photodetection region 905 to contact photodetection region 905. Contact plane 910 can be formed to cover electrically insulating material 907 along sides of photodetection region 905, extending from the electrically insulating material 907 above the top surface of photodetection region 905 towards the portion of electrically insulating material 907 contacting etch stop 904.

Contact plane 910 is conductively coupled to the photodetector of photodetection region 905 and disposed onto and contacting photodetection region 905 such that arrangement of the contact plane 910 can provide an optical aperture to photodetection region 905 and hence to the photodetector of photodetection region 905. Frequency selective surface 912 is disposed on photodetection region 905 within the optical aperture. Contact plane 910 can be formed contacting frequency selective surface 912. As can be seen in FIG. 9F, contact plane 910 can be disposed on edges of photodetection region 905 such that arrangement of the contact plane on the edges can provide the optical aperture to photodetection region 905 including frequency selective surface 912 disposed within the optical aperture. At this stage of processing, photodetection region 905 is disposed on etch stop layer 904 on substrate 901 providing a first constructed wafer 919.

A handle wafer can be attached to the first constructed wafer 919 of FIG. 9F. The handle wafer can be used to remove substrate 901 and etch stop layer 904. Removal of substrate 901 may be processed by mechanically polishing down to etch stop layer 904 with chemical etching to remove residual material of substrate 901. Chemicals can be applied to selectively remove etch top layer 904. Other removal techniques can be used such as by epitaxial liftoff. By using a handle wafer, substrate 901 can be removed from all focal plane array dies simultaneously.

Figure 9G:
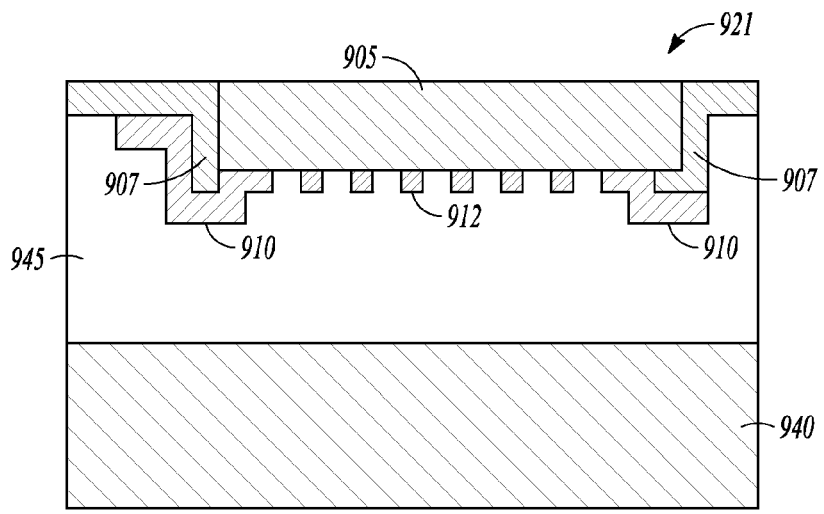

FIG. 9G shows a cross-sectional view of the first constructed wafer 919 after substrate 901 and etch stop layer 904 have been removed providing a second constructed wafer 921. Second constructed wafer 921 includes focal plane arrays having pixels, being formed, coupled to a handle wafer 940. Handle wafer 940 can be attached using a temporary bond polymer 945, where temporary bond polymer 945 separates the pixels being constructed from handle wafer 940. Temporary bond polymer 945 can be spin coated on one or both of constructed wafer 919 and handle wafer 940 with heat and pressure applied to accomplish the attachment or bonding. Room temperature processing of the attachment or bonding may be realized with temporary bond polymer 945 having appropriate viscosity.

Figure 9H:
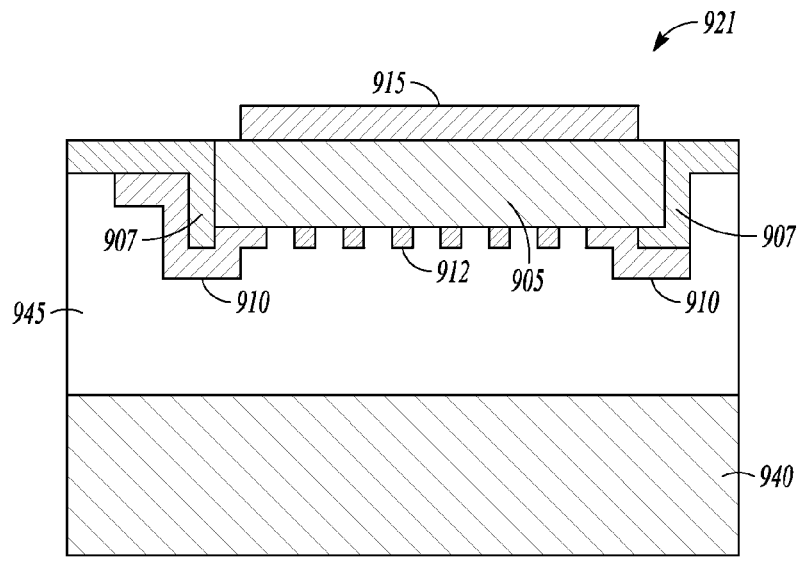

FIG. 9H shows a cross-sectional view of a photosensitive pixel being constructed using second constructed wafer 921 after forming a conductive plane 915 on photodetection region 905. Conductive plane 915 provides the respective photosensitive pixel with an electrical contact to couple to an external structure. Conductive plane 915 is disposed opposite the surface that will provide the optical aperture. With substrate 901 and etch stop layer 904 removed and with the focal plane arrays attached to handle wafer 940, the back side of the focal plane arrays, on which conductive plane 915 is disposed, can be further processed with additional structural features.

Figure 9I:
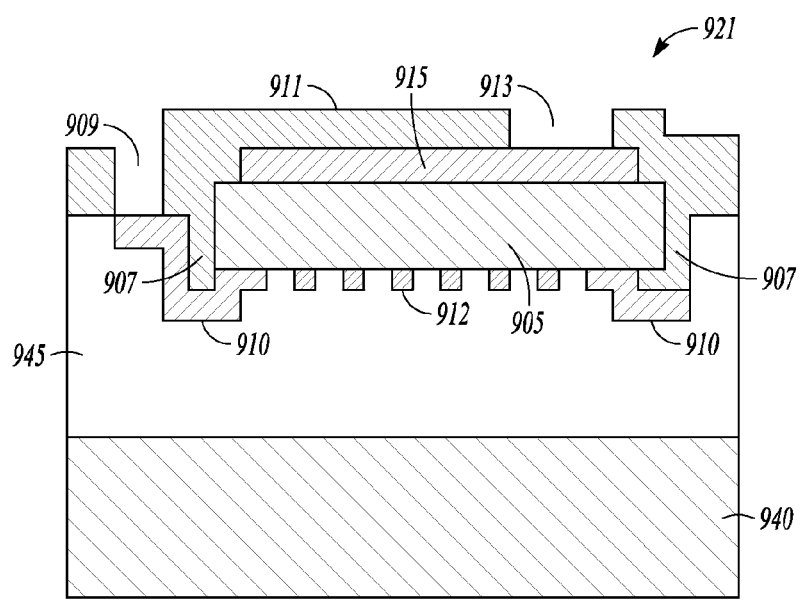

FIG. 9I shows a cross-sectional view of second constructed wafer 921 after additional processing. An electrically insulating material 911 is formed on electrically insulating material 907 and conductive plane 915. Electrically insulating material 911 is etched providing an opening 909 providing access to contact plane 910 and an opening 913 providing access to conductive plane 915.

Figure 9J:
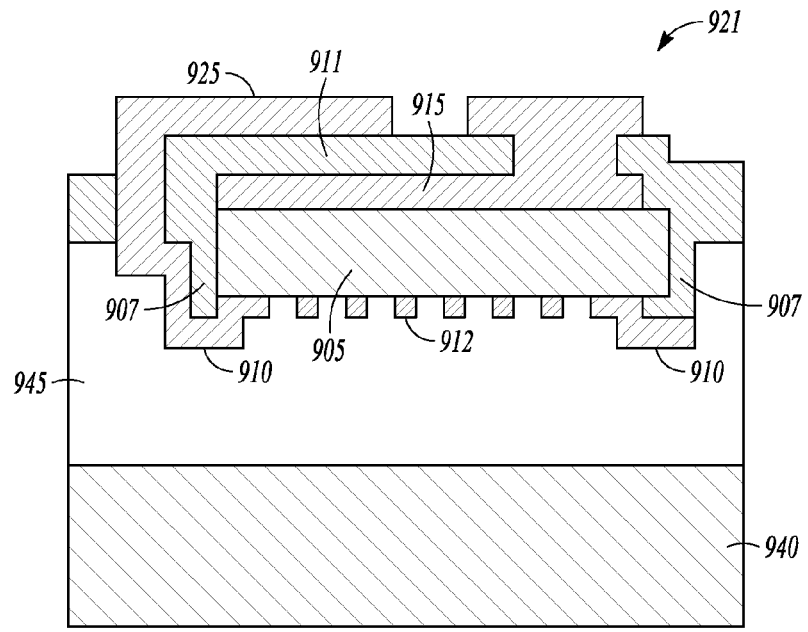

FIG. 9J shows a cross-sectional view of second constructed wafer 921 after additional processing following formation of electrically insulating material 911 and openings 909 and 913. Conductive material 925 is formed on electrically insulating material 911 and in opening 909 such that contact plane 910 connects to a portion of conductive material 925 disposed on electrically insulating material 911. Conductive material is formed in opening 913 on and contacting conductive plane 915 such that conductive plane 915 extends onto electrically insulating material 911. The portion of conductive plane 915 that extends onto electrically insulating material 911 is spaced apart from the portion of conductive material 925 on electrically insulating material 911, such that conductive plane 915 remains electrically separated from contact plane 910. Alternatively, opening 913 remains open and can be used as a pathway for a connector to a control circuit to electrically connect to conductive plane 915. See bump 924 of FIG. 9G that can be shaped to be disposed in opening 913 to contact conductive plane 915 when second constructed wafer 921 is mated to a wafer containing control circuits. Conductive material 925 and conductive material extending conductive plane 915 may be composed of material of contact plane 910, conductive plane 915, or other flexible conductive material.

Handle wafer 940 can be used to attach the pixels of the constructed focal plane arrays to control circuits on another wafer. The attachment may be realized by contacting the pixels of the constructed focal plane arrays to corresponding bumps disposed on conductive bonding pads of the control circuits on the other wafer. Such attachment can be performed using flip-chip bonding techniques. Alternatively, handle wafer 940 and temporary bond polymer 945 with attached focal plane arrays can be diced into individual dies that are then attached to its corresponding control circuit die followed by removal of handle wafer material and temporary bond polymer material. After bonding second wafer 921 to the wafer having the control circuits, via a solder bump using handle wafer 940, underfill epoxy can be placed between the second wafer 921 and the wafer having the control circuits. Though it is not always necessary to include the underfill epoxy, inclusion this epoxy adds some mechanical stability.

Figure 9K:
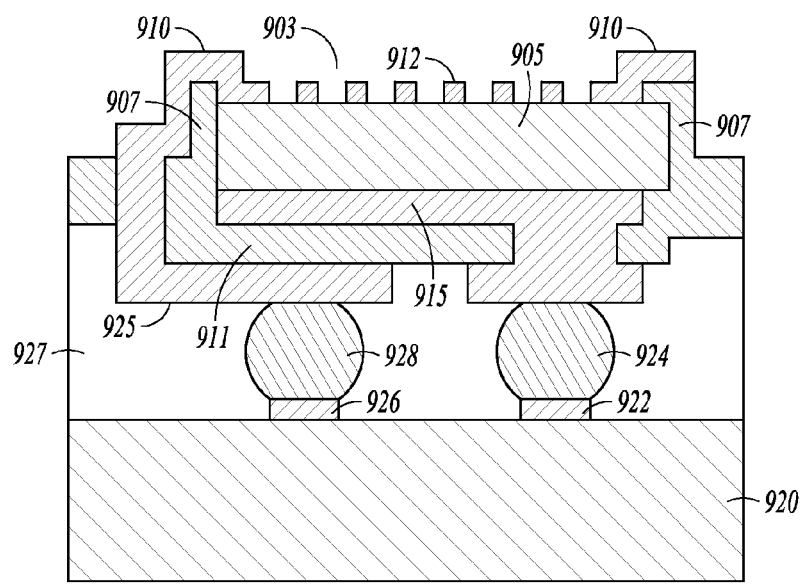

FIG. 9K shows a cross-sectional view of a pixel of a focal plane array coupled to control circuit 920 after handle wafer 940 and temporary bond polymer 945 are removed. Different processes can be used to remove handle wafer 940 including mechanical polishing. There are also a number of techniques to remove temporary bond polymer 945. For example, a selective polymer solvent can be used based on the chemistry to generate the material of temporary bond polymer 945 such that the selective polymer solvent basically only reacts to the material of temporary bond polymer 945. A polymer for temporary bond polymer 945 can be used that becomes soft at higher temperatures allowing handle wafer 940 to slide off when temporary bond polymer 945 is heated to at least a threshold level. Another kind of polymer can be used between temporary bond polymer 945 and the structure composed of the focal plane arrays along with associated components, such that when this other polymer is exposed to ultraviolet (UV) radiation, it causes bubbles to form, where these bubbles cause the structure to basically pop off of the handle wafer 940/temporary bond polymer 945.

Removal of handle wafer 940 and temporary bond polymer 945 can be conducted on a wafer scale or on a die basis if the handle wafer 940 was previously diced to apply to a control circuit diced from the other wafer. Alternatively, temporary bond polymer 945 and/or the combination of handle wafer 940 and temporary bond polymer 945, or portions thereof, need not be removed if handle wafer 940 and temporary bond polymer 945 are transparent to incident radiation in a wavelength range determined by the photodetector of photodetection region 905.

The use of handle wafer 940 and temporary bond polymer 945 arranges photodetection region 905 with optical aperture 903 provided by contact plane 910, with a frequency selective surface 912 within optical aperture 903, and with electrical contacts to a control circuit 920. One of the electrical contacts is provided by conductive plane 915 contacting bump 924 disposed on and contacting conductive bonding pad 922 of control circuit 920. Another one of the electrical contacts is provided by conductive material 925 contacting bump 928 disposed on and contacting conductive bonding pad 924 of control circuit 920. An optional underfill epoxy 927 can be included. Correlations between components of pixel 802 of FIG. 8 with the structures shown in FIGS. 9A-9K can be seen from comparing these figures and from the discussions herein.

Figure 10A:
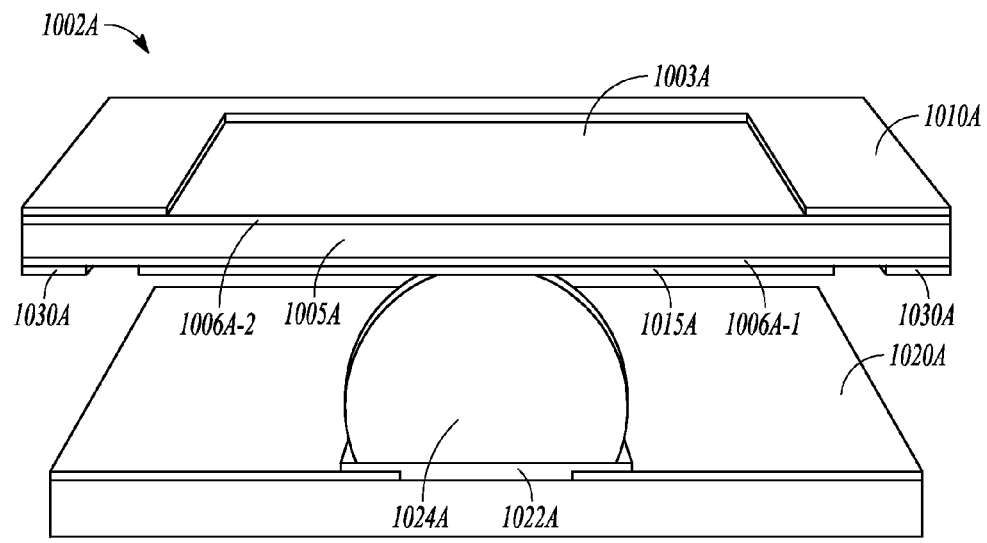
FIGS. 10A-10F are representations of other architectures of a pixel of a focal plane array, in accordance with various embodiments.

FIG. 10A is a representation of an embodiment of another example architecture of a pixel 1002A of a focal plane array. Pixel 1002A is a photosensitive pixel, which can be fabricated using wafer level integration. Pixel 1002A comprises photodetector 1005A, an electrical contact 1015A, and a contact plane 1010A with an optical aperture 1003A to the photodetector 1005A. Contact plane 1010A can be a flexible, highly conductive layer, which flexible, highly conductive layer can be realized by flexible metals, flexible metal composites, and flexible metallic-like materials that can include conductive polymers and conductive oxides, among others. Contact plane 1010A can be conductively coupled to photodetector 1005A and disposed on photodetector 1005A such that arrangement of contact plane 1010A provides optical aperture 1003A to photodetector 1005A. Depending on the type of photodetector employed, photodetector 1005A can include contact layers 1006A-1, 1006A-2 of doped semiconductor material to couple to each of electrical contact 1015A and contact plane 1010A. Photodetector 1005A can be conductively coupled to electrical contact 1015A, and electrical contact 1015A can be arranged to couple to a device or circuit external to the focal plane array. For example, the external device or circuit can be a read-out integrated circuit (ROIC) 1020A.

Pixel 1002A also comprises a control gate 1030A arranged to isolate the photosensitive pixel 1002A from the other photosensitive pixels of the focal plane array. Control gate 1030A can be realized as a transistor-like control gate. Control gate 1030A contacts contact layer 1006A-1 and is electrically separated from electrical contact 1015A.

Pixel 1002A of the FPA is one of a number of photosensitive pixels. The pixels can be arranged in a format of rows and columns. Other arrangements of pixels 1002A can be formed for the focal plane array. Each pixel of the FPA can be structured substantially the same, such that each pixel 1002A is a unit cell of the FPA. Contact plane 1010A can provide optical isolation between unit cells. Contact plane 1010A can be arranged as a metallic ground plane for the unit cells of the FPA. Contact plane 1010A can be disposed on edges of the photodetector 1005A such that arrangement of the contact plane 1010A on the edges provides the optical aperture 1003 to the photodetector 1005A.

As noted, ground plane 1010A can be composed of metallic-like material that provides flexibility. Besides flexible metals and metal composites, flexible metallic-like materials can include conductive polymers and conductive oxides, among others. Electrical contact 1015A may also use metallic-like material. Electrical contact 1015A may be composed of the same material as that of ground plane 1010A or of another metallic-like material that provides flexibility. Use of such material for ground plane 1010A can provide a FPA with increased thermal cycle lifetime as compared to using a semiconductor ground plane.

The respective photosensitive pixel 1002A of the focal plane array can be bonded to the device or circuit external to the focal plane array, such as ROIC 1020A, with a conductive bonding pad 1022A conductively coupled to the electrical contact 1015A of the respective photosensitive pixel 1002A. The conductive coupling can be realized using a conductive interconnect such as, but not limited to, a solder bump 1024A such as used in flip-chip bonding. Bump 1024A can be an indium bump. Each pixel of the focal plane array may be bonded in the same manner to the device or circuit external to the focal plane array, such as ROIC 1020A.

In addition to enhancements associated with other architectures discussed herein, the structure of pixel 1002A can provide a number of enhancements for a focal plane array. The structure of pixel 1002A allows photodetector 1005A to be electrically isolated from other photodetector pixels of the focal plane array. The structure of pixel 1002A may provide for reduced surface leakage relative to conventional FPA pixels. The structure of pixel 1002A allows for reduced number of fabrication steps relative to the number of fabrication steps of conventional FPA pixels.

Figure 10B:
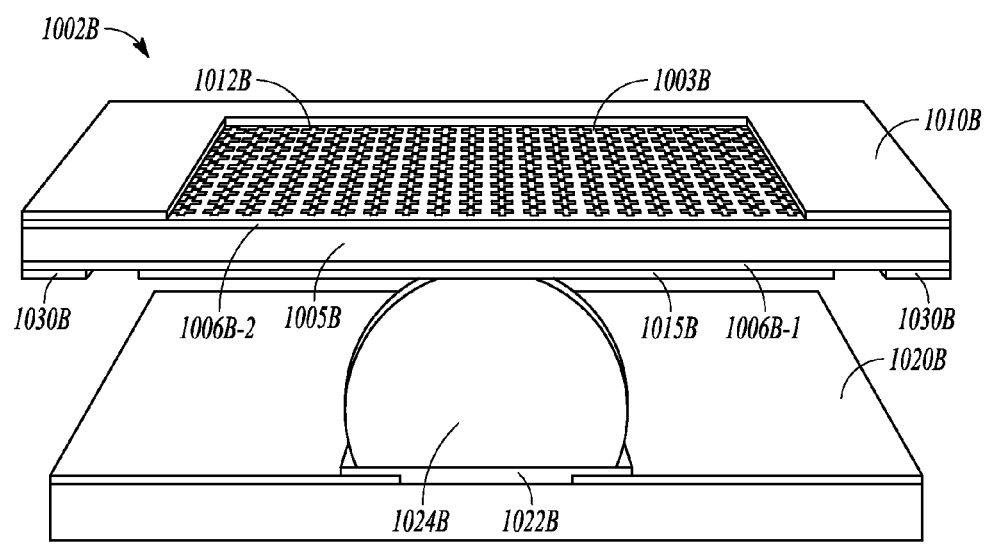

FIG. 10B is a representation of an embodiment of another example architecture of a pixel 1002B of a focal plane array. The architecture of pixel 1002B can be the same as pixel 1002A of FIG. 10A with a frequency selective surface 1012B as an added component. Pixel 1002B is a photosensitive pixel, which can be fabricated using wafer level integration. Pixel 1002B comprises photodetector 1005B, an electrical contact 1015B, and a contact plane 1010B with an optical aperture 1003B to the photodetector 1005B. Contact plane 1010B can be a flexible, highly conductive layer, which flexible, highly conductive layer can be realized by flexible metals, flexible metal composites, and flexible metallic-like materials that can include conductive polymers and conductive oxides, among others. Contact plane 1010B can be conductively coupled to photodetector 1005B and disposed on photodetector 1005B such that arrangement of contact plane 1010B provides optical aperture 1003B to photodetector 1005B. Depending on the type of photodetector employed, photodetector 1005B can include contact layers of doped semiconductor material to couple to each of electrical contact 1015B and contact plane 1010B. Photodetector 1005B can be conductively coupled to electrical contact 1015B, and electrical contact 1015B can be arranged to couple to a device or circuit external to the focal plane array. For example, the external device or circuit can be a read-out integrated circuit (ROIC) 1020B.

Pixel 1002B also comprises frequency selective surface 1012B, shown as a grid in FIG. 10B, disposed on photodetector 1005B within optical aperture 1003B formed by the arrangement of contact plane 1010B. Frequency selective surface 1012B is not limited to a grid pattern of rows and columns, but can be arranged in other shapes according to the application to which the focal plane array is designed and constructed. Frequency selective surface 1012B provides a mechanism to aid coupling of incoming radiation into a photodetector 1005B.

Pixel 1002B also comprises a control gate 1030B arranged to isolate the photosensitive pixel 1002B from the other photosensitive pixels of the focal plane array. Control gate 1030B can be realized as a transistor-like control gate. Control gate 1030B contacts contact layer 1006B-1 and is electrically separated from electrical contact 1015B.

Pixel 1002B of the FPA is one of a number of photosensitive pixels. The pixels can be arranged in a format of rows and columns. Other arrangements of pixels 1002B can be formed for the focal plane array. Each pixel of the FPA can be structured substantially the same, such that each pixel 1002B is a unit cell of the FPA. Contact plane 1010B can provide optical isolation between unit cells. Contact plane 1010B can be arranged as a metallic ground plane for the unit cells of the FPA. Contact plane 1010B can be disposed on edges of the photodetector 1005B such that arrangement of the contact plane 1010B on the edges provides the optical aperture 1003B to the photodetector 1005B.

As noted, ground plane 1010B can be composed of metallic-like material that provides flexibility. Besides flexible metals and metal composites, flexible metallic-like materials can include conductive polymers and conductive oxides, among others. Electrical contact 1015B may also use metallic-like material. Electrical contact 1015B may be composed of the same material as that of ground plane 1010B or of another metallic-like material that provides flexibility. Use of such material for ground plane 1010B can provide a FPA with increased thermal cycle lifetime as compared to using a semiconductor ground plane.

The respective photosensitive pixel 1002B of the focal plane array can be bonded to the device or circuit external to the focal plane array, such as ROIC 1020B, with a conductive bonding pad 1022B conductively coupled to the electrical contact 1015B of the respective photosensitive pixel 1002B. The conductive coupling can be realized using a conductive interconnect such as, but not limited to, a solder bump 1024B such as used in flip-chip bonding. Bump 1024B can be an indium bump. Each pixel of the focal plane array may be bonded in the same manner to the device or circuit external to the focal plane array, such as ROIC 1020B.

In addition to enhancements associated with other architectures discussed herein, the structure of pixel 1002B can provide a number of enhancements for a focal plane array. The structure of pixel 1002B allows photodetector 1005B to be electrically isolated from other photodetector pixels of the focal plane array. When an electrical bias is applied to the transistor-like contact, photodetector material directly below the contact becomes more electrically insulating. The structure of pixel 1002B may provide for reduced surface leakage relative to pixels that require a mesa etch through the active region of the photodetector. The structure of pixel 1002B allows for reduced number of fabrication steps relative to the number of fabrication steps of conventional FPA pixels with enhanced functionality.

Figure 10C:
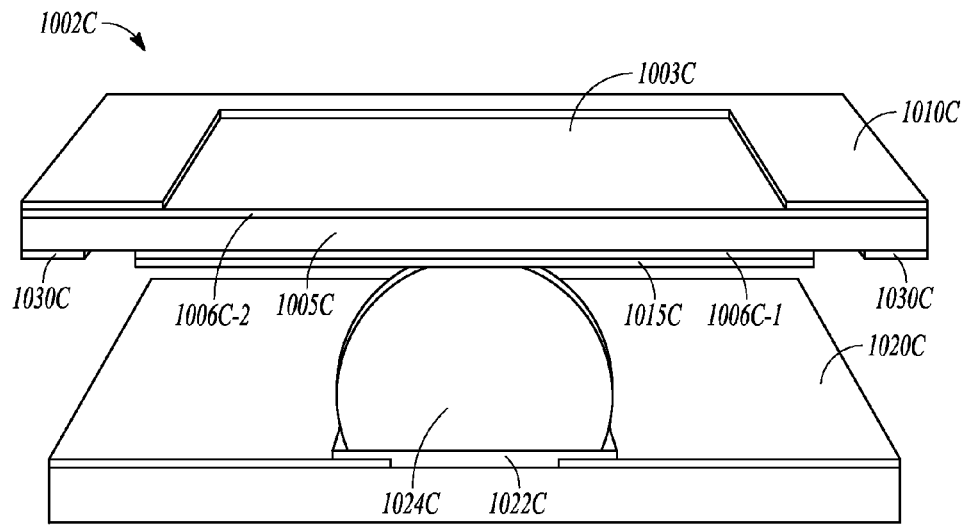

FIG. 10C is a representation of an embodiment of another example architecture of a pixel 1002C of a focal plane array. The architecture of pixel 1002C can be the same as or similar to pixel 1002A of FIG. 10A in which a control gate 1030C contacts a photodetector 1105C. Pixel 1002C is a photosensitive pixel, which can be fabricated using wafer level integration. Pixel 1002C comprises photodetector 1005C, an electrical contact 1015C, and a contact plane 1010C with an optical aperture 1003C to the photodetector 1005C. Contact plane 1010C can be a flexible, highly conductive layer, which flexible, highly conductive layer can be realized by flexible metals, flexible metal composites, and flexible metallic-like materials that can include conductive polymers and conductive oxides, among others. Contact plane 1010C can be conductively coupled to photodetector 1005C and disposed on photodetector 1005C such that arrangement of contact plane 1010C provides optical aperture 1003C to photodetector 1005C. Depending on the type of photodetector employed, photodetector 1005C use contact layers 1006C-1, 1006C-2 of doped semiconductor material to couple to each of electrical contact 1015C and contact plane 1010C. Photodetector 1005C can be conductively coupled to electrical contact 1015C, and electrical contact 1015C can be arranged to couple to a device or circuit external to the focal plane array. For example, the external device or circuit can be a read-out integrated circuit (ROIC) 1020C.

Pixel 1002C also comprises control gate 1030C arranged to isolate the photosensitive pixel 1002C from the other photosensitive pixels of the focal plane array. Control gate 1030C can be realized as a transistor-like control gate. Control gate 1030C contacts photodetector 1005C in a region adjacent to contact layer 1006C-1 and is electrically separated from electrical contact 1015C. This adjacent region can be realized as an area where a portion of doped semiconductor region 1006C-1 has been etched away.

Pixel 1002C of the FPA is one of a number of photosensitive pixels. The pixels can be arranged in a format of rows and columns. Other arrangements of pixels 1002C can be formed for the focal plane array. Each pixel of the FPA can be structured substantially the same, such that each pixel 1002C is a unit cell of the FPA. Contact plane 1010C can provide optical isolation between unit cells. Contact plane 1010C can be arranged as a metallic ground plane for the unit cells of the FPA. Contact plane 1010C can be disposed on edges of the photodetector 1005C such that arrangement of the contact plane 1010C on the edges provides the optical aperture 1003C to the photodetector 1005C.

As noted, ground plane 1010C can be composed of metallic-like material that provides flexibility. Besides flexible metals and metal composites, flexible metallic-like materials can include conductive polymers and conductive oxides, among others. Electrical contact 1015C may also use metallic-like material. Electrical contact 1015C may be composed of the same material as that of ground plane 1010C or of another metallic-like material that provides flexibility. Control gate 1030C may be composed of the same material as contact plane 1010C and/or electrical contact 1015C or other appropriate conductive material. Use of such material for ground plane 1010C can provide a FPA with increased thermal cycle lifetime as compared to using a semiconductor ground plane.

The respective photosensitive pixel 1002C of the focal plane array can be bonded to the device or circuit external to the focal plane array, such as ROIC 1020C, with a conductive bonding pad 1022C conductively coupled to the electrical contact 1015C of the respective photosensitive pixel 1002C. The conductive coupling can be realized using a conductive interconnect such as, but not limited to, a solder bump 1024C such as used in flip-chip bonding. Bump 1024C can be an indium bump. Each pixel of the focal plane array may be bonded in the same manner to the device or circuit external to the focal plane array, such as ROIC 1020C.

In addition to enhancements associated with other architectures discussed herein, the structure of pixel 1002C can provide a number of enhancements for a focal plane array. The structure of pixel 1002C allows photodetector 1005C to be electrically isolated from other photodetector pixels of the focal plane array. The structure of pixel 1002C may provide for reduced surface leakage relative to conventional FPA pixels. The structure of pixel 1002C can allow for reduced number of fabrication steps relative to the number of fabrication steps of conventional FPA pixels.

Figure 10D:
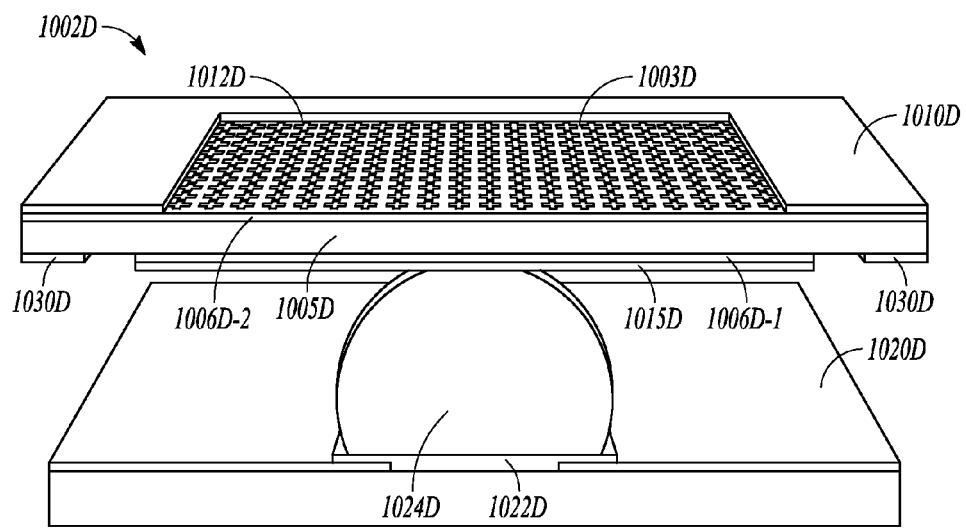

FIG. 10D is a representation of an embodiment of another example architecture of a pixel 1002D of a focal plane array. The architecture of pixel 1002D can be the same as or similar to pixel 1002B of FIG. 10B in which a control gate 1030D contacts a photodetector 1105D. Pixel 1002D is a photosensitive pixel, which can be fabricated using wafer level integration. Pixel 1002D comprises photodetector 1005D, an electrical contact 1015D, and a contact plane 1010 D with an optical aperture 1003D to the photodetector 1005 D. Contact plane 1010D can be a flexible, highly conductive layer, which flexible, highly conductive layer can be realized by flexible metals, flexible metal composites, and flexible metallic-like materials that can include conductive polymers and conductive oxides, among others. Contact plane 1010D can be conductively coupled to photodetector 1005D and disposed on photodetector 1005D such that arrangement of contact plane 1010D provides optical aperture 1003D to photodetector 1005D. Depending on the type of photodetector employed, photodetector 1005D can use contact layers 1006D-1, 1006D-2 of doped semiconductor material to couple to each of electrical contact 1015D and contact plane 1010D. Photodetector 1005D can be conductively coupled to electrical contact 1015D, and electrical contact 1015D can be arranged to couple to a device or circuit external to the focal plane array. For example, the external device or circuit can be a read-out integrated circuit (ROIC) 1020D.

Pixel 1002D also comprises frequency selective surface 1012D, shown as a grid in FIG. 10D, disposed on photodetector 1005D within optical aperture 1003D formed by the arrangement of contact plane 1010D. Frequency selective surface 1012D is not limited to a grid pattern of rows and columns, but can be arranged in other shapes according to the application to which the focal plane array is designed and constructed. Frequency selective surface 1012D provides a mechanism to aid coupling of incoming radiation into a photodetector 1005D.

Pixel 1002D also comprises control gate 1030D arranged to isolate the photosensitive pixel 1002D from the other photosensitive pixels of the focal plane array. Control gate 1030D can be realized as a transistor-like control gate. Control gate 1030D contacts photodetector 1005D in a region adjacent to contact layer 1006D-1 and is electrically separated from electrical contact 1015D. This adjacent region can be realized as an area where a portion of doped semiconductor region 1006D-1 has been etched away.

Pixel 1002D of the FPA is one of a number of photosensitive pixels. The pixels can be arranged in a format of rows and columns. Other arrangements of pixels 1002D can be formed for the focal plane array. Each pixel of the FPA can be structured substantially the same, such that each pixel 1002D is a unit cell of the FPA. Contact plane 1010D can provide optical isolation between unit cells. Contact plane 1010D can be arranged as a metallic ground plane for the unit cells of the FPA. Contact plane 1010D can be disposed on edges of the photodetector 1005D such that arrangement of the contact plane 1010D on the edges provides the optical aperture 1003D to the photodetector 1005D.

As noted, ground plane 1010D can be composed of metallic-like material that provides flexibility. Besides flexible metals and metal composites, flexible metallic-like materials can include conductive polymers and conductive oxides, among others. Electrical contact 1015D may also use metallic-like material. Electrical contact 1015D may be composed of the same material as that of ground plane 1010D or of another metallic-like material that provides flexibility. Control gate 1030D may be composed of the same material as contact plane 1010D and/or electrical contact 1015D or other appropriate conductive material. Use of such material for ground plane 1010D can provide a FPA with increased thermal cycle lifetime as compared to using a semiconductor ground plane.

The respective photosensitive pixel 1002D of the focal plane array can be bonded to the device or circuit external to the focal plane array, such as ROIC 1020D, with a conductive bonding pad 1022D conductively coupled to the electrical contact 1015D of the respective photosensitive pixel 1002D. The conductive coupling can be realized using a conductive interconnect such as, but not limited to, a solder bump 1024D such as used in flip-chip bonding. Bump 1024D can be an indium bump. Each pixel of the focal plane array may be bonded in the same manner to the device or circuit external to the focal plane array, such as ROIC 1020D.

In addition to enhancements associated with other architectures discussed herein, the structure of pixel 1002D can provide a number of enhancements for a focal plane array. The structure of pixel 1002D allows photodetector 1005D to be electrically isolated from other photodetector pixels of the focal plane array. The structure of pixel 1002D may provide for reduced surface leakage relative to conventional FPA pixels. The structure of pixel 1002D can allow for reduced number of fabrication steps relative to the number of fabrication steps of conventional FPA pixels.

Figure 10E:
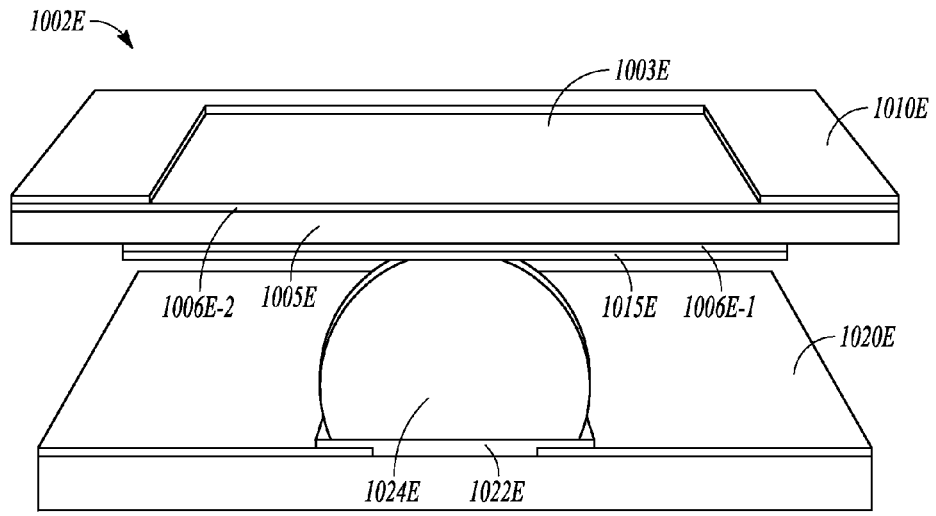

FIG. 10E is a representation of an embodiment of another example architecture of a pixel 1002E of a focal plane array. The architecture of pixel 1002E can be the same as or similar to pixel 1002C of FIG. 10C without having a control gate contacting a photodetector. Pixel 1002E is a photosensitive pixel, which can be fabricated using wafer level integration. Pixel 1002E comprises a photodetector 1005E, an electrical contact 1015E, and a contact plane 1010E with an optical aperture 1003E to the photodetector 1005E. Contact plane 1010E can be a flexible, highly conductive layer, which flexible, highly conductive layer can be realized by flexible metals, flexible metal composites, and flexible metallic-like materials that can include conductive polymers and conductive oxides, among others. Contact plane 1010E can be conductively coupled to photodetector 1005E and disposed on photodetector 1005E such that arrangement of contact plane 1010E provides optical aperture 1003E to photodetector 1005E. Depending on the type of photodetector employed, photodetector 1005E can use contact layers 1006E-1, 1006E-2 of doped semiconductor material to couple to each of electrical contact 1015E and contact plane 1010E. Photodetector 1005E can be conductively coupled to electrical contact 1015E, and electrical contact 1015E can be arranged to couple to a device or circuit external to the focal plane array. For example, the external device or circuit can be a read-out integrated circuit (ROIC) 1020E.

Pixel 1002E also comprises an arrangement of photodetector 1005E and electrical contact 1015E to isolate the photosensitive pixel 1002E from the other photosensitive pixels of the focal plane array. Electrical contact 1015E may be limited in its extent across pixel 1002E by limiting contact layer 1006E-1 to which electrical contact 1015E is arranged. A doped semiconductor region of contact layer 1006E-1 can be removed on the edges of pixel 1002E. The extent of the removal may optionally be substantially equal to the length at which contact plane 1010 extends inward from the ends of pixel 1002E.

Pixel 1002E of the FPA is one of a number of photosensitive pixels. The pixels can be arranged in a format of rows and columns. Other arrangements of pixels 1002E can be formed for the focal plane array. Each pixel of the FPA can be structured substantially the same, such that each pixel 1002E is a unit cell of the FPA. Contact plane 1010E can provide optical isolation between unit cells. Contact plane 1010E can be arranged as a metallic ground plane for the unit cells of the FPA. Contact plane 1010E can be disposed on edges of the photodetector 1005 such that arrangement of the contact plane 1010E on the edges provides the optical aperture 1003E to the photodetector 1005E.

As noted, ground plane 1010E can be composed of metallic-like material that provides flexibility. Besides flexible metals and metal composites, flexible metallic-like materials can include conductive polymers and conductive oxides, among others. Electrical contact 1015E may also use metallic-like material. Electrical contact 1015E may be composed of the same material as that of ground plane 1010E or of another metallic-like material that provides flexibility. Use of such material for ground plane 1010E can provide a FPA with increased thermal cycle lifetime as compared to using a semiconductor ground plane.

The respective photosensitive pixel 1002E of the focal plane array can be bonded to the device or circuit external to the focal plane array, such as ROIC 1020E, with a conductive bonding pad 1022E conductively coupled to the electrical contact 1015E of the respective photosensitive pixel 1002E. The conductive coupling can be realized using a conductive interconnect such as, but not limited to, a solder bump 1024E such as used in flip-chip bonding. Bump 1024E can be an indium bump. Each pixel of the focal plane array may be bonded in the same manner to the device or circuit external to the focal plane array, such as ROIC 1020E.

In addition to enhancements associated with other architectures discussed herein, the structure of pixel 1002E can provide a number of enhancements for a focal plane array. The structure of pixel 1002E allows photodetector 1005E to be electrically isolated from other photodetector pixels of the focal plane array. The structure of pixel 1002E may provide for reduced surface leakage relative to conventional FPE pixels. The structure of pixel 1002E may allow for reduced number of fabrication steps relative to the number of fabrication steps of conventional FPA pixels.

Figure 10F:
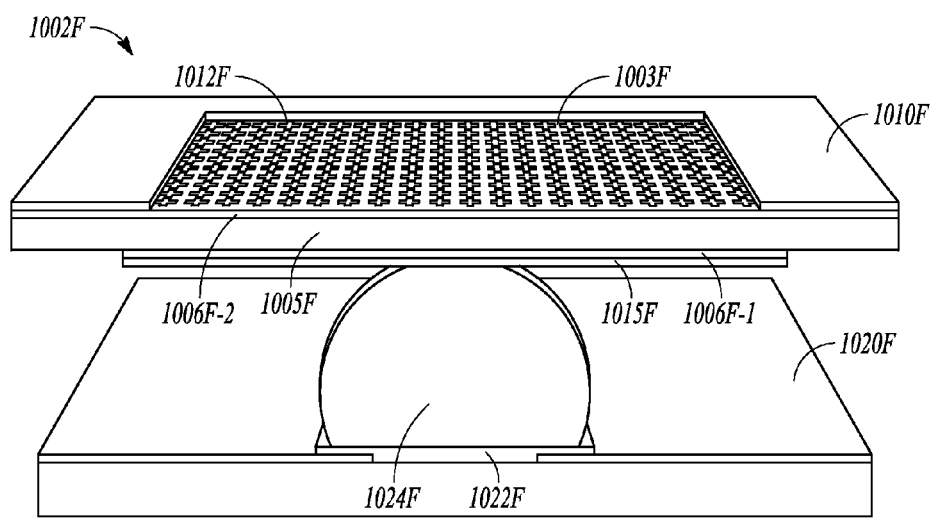

FIG. 10F is a representation of an embodiment of another example architecture of a pixel 1002F of a focal plane array. The architecture of pixel 1002F can be the same as or similar to pixel 1002D of FIG. 10D without having a control gate contacting a photodetector. Pixel 1002F is a photosensitive pixel, which can be fabricated using wafer level integration. Pixel 1002F comprises a photodetector 1005F, an electrical contact 1015F, and a contact plane 1010F with an optical aperture 1003F to the photodetector 1005F. Contact plane 1010F can be a flexible, highly conductive layer, which flexible, highly conductive layer can be realized by flexible metals, flexible metal composites, and flexible metallic-like materials that can include conductive polymers and conductive oxides, among others. Contact plane 1010F can be conductively coupled to photodetector 1005F and disposed on photodetector 1005F such that arrangement of contact plane 1010F provides optical aperture 1003F to photodetector 1005F. Depending on the type of photodetector employed, photodetector 1005F can include contact layers 1006F-1, 1006F-2 of doped semiconductor material to couple to each of electrical contact 1015F and contact plane 1010F. Photodetector 1005F can be conductively coupled to electrical contact 1015F, and electrical contact 1015F can be arranged to couple to a device or circuit external to the focal plane array. For example, the external device or circuit can be a read-out integrated circuit (ROIC) 1020F.

Pixel 1002F also comprises frequency selective surface 1012F, shown as a grid in FIG. 10F, disposed on photodetector 1005F within optical aperture 1003F formed by the arrangement of contact plane 1010F. Frequency selective surface 1012F is not limited to a grid pattern of rows and columns, but can be arranged in other shapes according to the application to which the focal plane array is designed and constructed. Frequency selective surface 1012F provides a mechanism to aid coupling of incoming radiation into a photodetector 1005F.

Pixel 1002F also comprises an arrangement of photodetector 1005F and electrical contact 1015F to isolate the photosensitive pixel 1002F from the other photosensitive pixels of the focal plane array. Electrical contact 1015F may be limited in its extent across pixel 1002F by limiting contact layer 1006F-1 to which electrical contact 1015F is arranged. A doped semiconductor region of contact layer 1006F-1 can be removed on the edges of pixel 1002F. The extent of the removal may optionally be substantially equal to the length at which contact plane 1010F extends inward from the ends of pixel 1002F.

Pixel 1002F of the FPA is one of a number of photosensitive pixels. The pixels can be arranged in a format of rows and columns. Other arrangements of pixels 1002F can be formed for the focal plane array. Each pixel of the FPA can be structured substantially the same, such that each pixel 1002F is a unit cell of the FPA. Contact plane 1010F can provide optical isolation between unit cells. Contact plane 1010F can be arranged as a metallic ground plane for the unit cells of the FPA. Contact plane 1010F can be disposed on edges of the photodetector 1005F such that arrangement of the contact plane 1010F on the edges provides the optical aperture 1003F to the photodetector 1005F.

As noted, ground plane 1010F can be composed of metallic-like material that provides flexibility. Besides flexible metals and metal composites, flexible metallic-like materials can include conductive polymers and conductive oxides, among others. Electrical contact 1015F may also use metallic-like material. Electrical contact 1015F may be composed of the same material as that of ground plane 1010F or of another metallic-like material that provides flexibility. Use of such material for ground plane 1010F can provide a FPA with increased thermal cycle lifetime as compared to using a semiconductor ground plane.

The respective photosensitive pixel 1002F of the focal plane array can be bonded to the device or circuit external to the focal plane array, such as ROIC 1020F, with a conductive bonding pad 1022F conductively coupled to the electrical contact 1015F of the respective photosensitive pixel 1002F. The conductive coupling can be realized using a conductive interconnect such as, but not limited to, a solder bump 1024F such as used in flip-chip bonding. Bump 1024F can be an indium bump. Each pixel of the focal plane array may be bonded in the same manner to the device or circuit external to the focal plane array, such as ROIC 1020F.

In addition to enhancements associated with other architectures discussed herein, the structure of pixel 1002F can provide a number of enhancements for a focal plane array. The structure of pixel 1002F allows photodetector 1005 to be electrically isolated from other photodetector pixels of the focal plane array. The structure of pixel 1002F may provide for reduced surface leakage relative to conventional FPA pixels. The structure of pixel 1002F may allow for reduced number of fabrication steps relative to the number of fabrication steps of conventional FPA pixels.

Figure 11A:
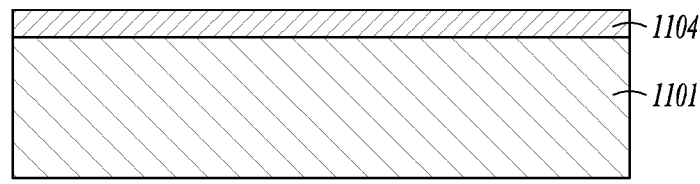
FIGS. 11A-11F show features of an example method of fabricating focal plane arrays, in accordance with various embodiments.
Figure 11B:
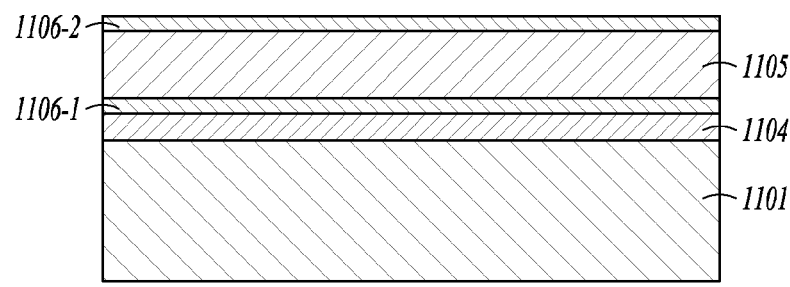

FIGS. 11A-11F show features of an embodiment of a method of fabricating focal plane arrays. Each focal plane array has an array of photosensitive pixels. This method can be used to fabricate the pixels of the focal plane array represented in FIGS. 10A-10F with variations in processing to match the variations in the architectures of pixels 1002A, 1002B, 1002C, 1002D, 1002E, and 1002F. Processing as shown in FIGS. 11A-11F provides a mechanism to fabricate focal plane arrays and apply these focal plane arrays to control circuits on a wafer level. FIG. 11A is a representation of a substrate 1101 after an etch stop layer 1104 has been applied to substrate 1101. A photodetection region 1105 can be formed on etch stop layer 1104. Photodetection region 1105 can include a semiconductor-based photodetector having an active region and outer layers doped to provide contacts to the active region. One of the outer layers, contact layer 1106-1, can contact etch stop layer 1104 and another outer layer, contact layer 1106-2, can be disposed at the surface region of photodetection region 1105, opposite etch stop layer 1104. FIG. 11B is a representation of photodetection region 1105 disposed on etch stop layer 1104 on substrate 1101 after photodetection region 1105 has been formed.

Figure 11C:
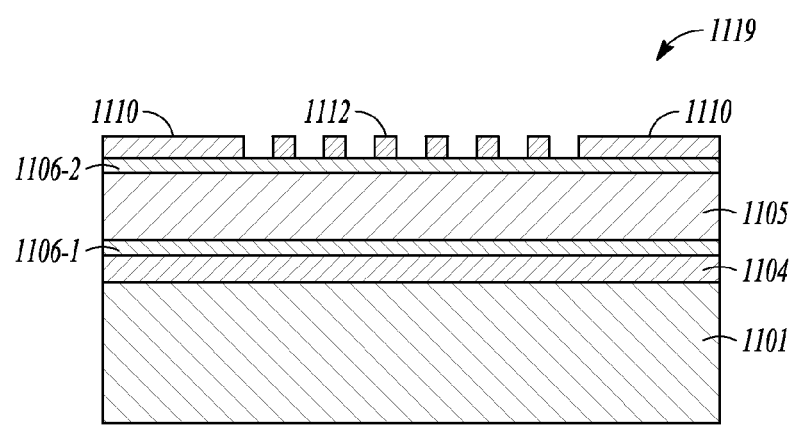

FIG. 11C is a cross-sectional view showing a contact plane 1110 formed on photodetection region 1105 and a frequency selective surface 1112 formed photodetection region 1105 after photodetection region 1105 has been formed on etch stop layer 1104 on substrate 1101. This processing can be conducted in fabricating pixels 1002B of FIG. 10B, 1002D of FIG. 10D, and 1002F of FIG. 10F. Alternatively, a frequency selective surface 1112 is not formed in a process fabricating pixels 1002A of FIG. 10A, 1002C of FIG. 10C, and 1002E of FIG. 10E.

Contact plane 1110 can be formed using a highly conductive metallic-like material that provides flexibility. Besides flexible metals and metal composites, flexible metallic-like materials can include conductive polymers and conductive oxides. Contact plane 1110 is conductively coupled to the photodetector of photodetection region 1105 and disposed onto and contacting photodetection region 1105 such that arrangement of the contact plane 1110 can provide an optical aperture to photodetection region 1105 and hence to the photodetector of photodetection region 1105.

Frequency selective surface 1112 is disposed on photodetection region 1105 within the optical aperture. Frequency selective surface 1112 can be formed as an array or grid of metallic or dielectric material on photodetection region 1105. Frequency selective surface 1112 is not limited to a grid pattern of rows and columns, but can be arranged in other shapes according to the application to which the focal plane array is designed and constructed. As can be seen in FIG. 11F, contact plane 1110 can be disposed on edges of photodetection region 1105 such that arrangement of contact plane 1110 on the edges can provide the optical aperture to photodetection region 1105 including frequency selective surface 1112 disposed within the optical aperture. At this stage of processing, photodetection region 1105 is disposed on etch stop layer 1104 on substrate 1101 providing a first constructed wafer 1119.

A handle wafer can be attached to the first constructed wafer 1119 of FIG. 11C. The handle wafer can be used to remove substrate 1101 and etch stop layer 1104. Removal of substrate 1101 may be processed by mechanically polishing down to etch stop layer 1104 with chemical etching to remove residual material of substrate 1101. Chemicals can be applied to selectively remove etch top layer 1104. Other removal techniques can be used such as by epitaxial liftoff. By using a handle wafer, substrate 1101 can be removed from all focal plane array dies simultaneously.

Figure 11D:
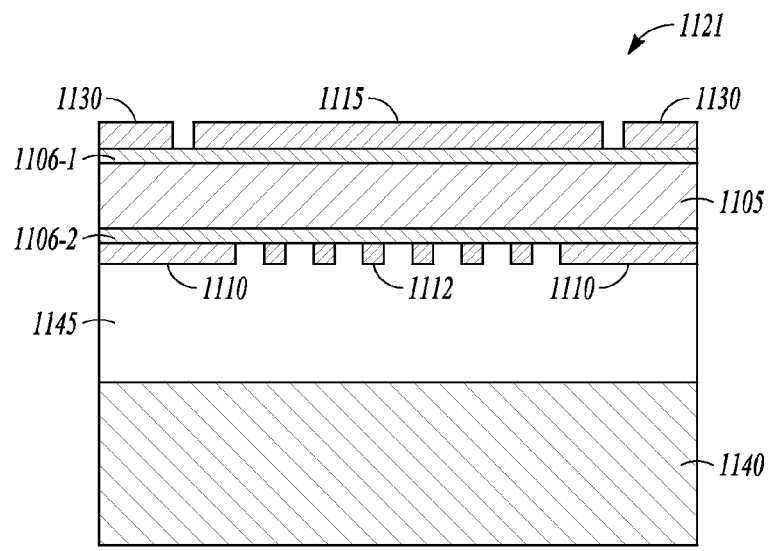

FIG. 11D shows a cross-sectional view of the first constructed wafer 1119 after substrate 1101 and etch stop layer 1104 have been removed providing a second constructed wafer 1121 that can be further processed. Second constructed wafer 1121 includes focal plane arrays having pixels, being formed, coupled to a handle wafer 1140 including contact plane 1110 and frequency selective surface 1112. Handle wafer 1140 can be attached using a temporary bond polymer 1145, where temporary bond polymer 1145 separates the pixels being constructed from handle wafer 1140. Temporary bond polymer 1145 can be spin coated on one or both of constructed wafer 1119 and handle wafer 1140 with heat and pressure applied to accomplish the attachment or bonding. Room temperature processing of the attachment or bonding may be realized with temporary bond polymer 1145 having appropriate viscosity.

FIG. 11D also shows the formation of a conductive plane 1115 on photodetection region 1105. Conductive plane 1115 provides the respective photosensitive pixel with an electrical contact to couple to an external structure. Conductive plane 1115 is disposed opposite the surface that will provide the optical aperture. In addition, conductive region 1130 is formed on photodetection region 1105. Conductive region 1130 may be formed separately from forming conductive plane 1115. Alternatively, conductive region 1130 can be formed by etching openings in conductive plane 1115, electrically isolating conductive region 1130 from conductive plane 1115. Conductive region 1130 is constructed to provide a control gate. Control gate 1130 can be structured as a transistor-like control gate.

In an alternative processing, prior to forming conductive plane 1115 and conductive region 1130, a shallow etch can be perform on edge regions of photodetection region 1105 removing a portion of contact layer 1106-1 such that conductive region 1130 can be formed on an active region of photodetection region 1105 in the etched regions. In such a processing, conductive region 1130 may have thickness substantially equal to or less than that of the etched regions, where conductive plane 1115 effectively is formed on un-etched photodetection region 1105 disposed at a level above conductive region 1130, further electrically isolating plane conductive plane 1115 from conductive region 1130 that will provide a gate control. This etch process can be used in forming pixels 1002C of FIG. 10C and pixels 10D of FIG. 10D.

In another variation, with a shallow etch performed on edge regions of photodetection region 1105 and plane conductive plane 1115 formed on effectively un-etched photodetection region 1105, formation of a control gate, hence conductive region 1130, as performed above may be eliminated with forming conductive plane 1115 on contact layer 1106-1. Conductive plane 1115 may be arranged to be opposite the optical aperture such that conductive plane 1115 is directly under the optical aperture and substantially not directly below contact plane 1110. This etch process, in which a control gate is not formed, can be used in forming pixels 1002E of FIG. 10E and pixels 10F of FIG. 10F.

Figure 11E:
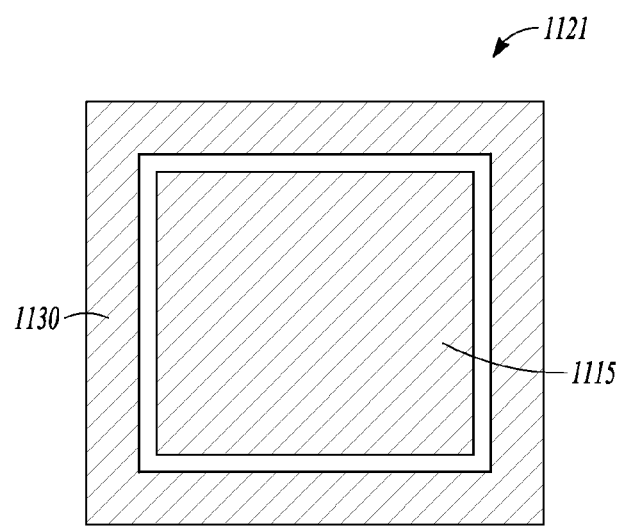
Figure 11F:
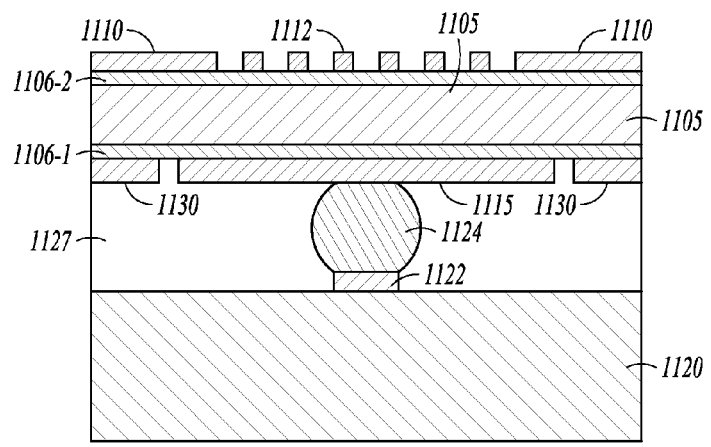

FIG. 11E shows a top view of second constructed wafer 1121 showing an example of a spatial relationship between conductive plane 1115 and conductive region 1130 formed as a control gate. With substrate 1101 and etch stop layer 1104 removed and with the focal plane arrays attached to handle wafer 1140, the back side of the focal plane arrays, on which conductive plane 1115 is disposed, can be further processed with additional structural features.

Handle wafer 1140 can be used to attach the pixels of the constructed focal plane arrays to control circuits on another wafer. The attachment may be realized by contacting the pixels of the constructed focal plane arrays to corresponding bumps disposed on conductive bonding pads of the control circuits on the other wafer. Such attachment can be performed using flip-chip bonding techniques. Alternatively, handle wafer 1140 and temporary bond polymer 1145 with attached focal plane arrays can be diced into individual dies that are then attached to its corresponding control circuit die followed by removal of handle wafer material and temporary bond polymer material. After bonding second wafer 1121 to the wafer having the control circuits, via a solder bump using handle wafer 1140, underfill epoxy can be placed between the second wafer 1121 and the wafer having the control circuits. Though it is not always necessary to include the underfill epoxy, inclusion this epoxy adds some mechanical stability.

FIG. 11F shows a cross-sectional view of a pixel of a focal plane array coupled to control circuit 1120 after handle wafer 1140 and temporary bond polymer 1145 are removed. Different processes can be used to remove handle wafer 1140 including mechanical polishing. There are also a number of techniques to remove temporary bond polymer 1145. For example, a selective polymer solvent can be used based on the chemistry to generate the material of temporary bond polymer 1145 such that the selective polymer solvent basically only reacts to the material of temporary bond polymer 1145. A polymer for temporary bond polymer 1145 can be used that becomes soft at higher temperatures allowing handle wafer 1140 to slide off when temporary bond polymer 1145 is heated to at least a threshold level. Another kind of polymer can be used between temporary bond polymer 1145 and the structure composed of the focal plane arrays along with associated components, such that when this other polymer is exposed to ultraviolet (UV) radiation, it causes bubbles to form, where these bubbles cause the structure to basically pop off of the handle wafer 1140/temporary bond polymer 1145.

Removal of handle wafer 1140 and temporary bond polymer 1145 can be conducted on a wafer scale or on a die basis if the handle wafer 1140 was previously diced to apply to a control circuit diced from the other wafer. Alternatively, temporary bond polymer 1145 and/or the combination of handle wafer 1140 and temporary bond polymer 1145, or portions thereof, need not be removed if handle wafer 1140 and temporary bond polymer 1145 are transparent to incident radiation in a wavelength range determined by the photodetector of photodetection region 1105.

The use of handle wafer 1140 and temporary bond polymer 1145 arranges photodetection region 1105 with optical aperture 1103 provided by contact plane 1110, with a frequency selective surface 1112 within optical aperture 1103, with control gate 1130, and with electrical contact to a control circuit 1120. Electrical contact to a control circuit 1120 is provided by conductive plane 1115 contacting bump 1124 disposed on and contacting conductive bonding pad 1122 of control circuit 1120. An optional underfill epoxy 1127 can be included. Correlations between components of pixels 1002A of FIG. 10A, 1002B of FIG. 10B, 1002C of FIG. 10C, 1002D of FIG. 10D, 1002E of FIG. 10E, and 1002F of FIG. 10F with the structures shown in FIGS. 11A-11F can be seen from comparing these figures and from the discussions herein.

Figure 12:
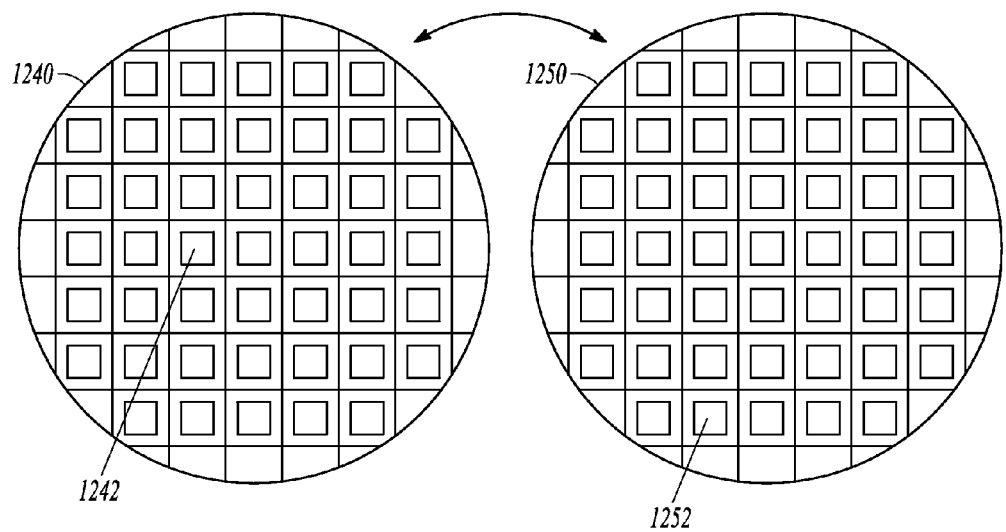
FIG. 12 is a representation of a handle wafer having a plurality of focal plane array dies being coupled with a wafer having a plurality of integrated circuits to which respective ones of the focal plane array dies are to be bonded, in accordance with various embodiments.

As taught herein, a metallic or metallic-like conductive plane used as a conductive plane, such as a conductive ground plane, in focal plane arrays allow fabrication of the focal plane arrays at the wafer level. With the additional use of a handle wafer, focal plane arrays can be bonded to external circuits, such as read-out control integrated circuits on a wafer scale basis. FIG. 12 is a representation of a handle wafer 1240 having a plurality of focal plane array dies 1242 being coupled with a wafer 1250 having a plurality of integrated circuits 1252 to which respective ones of focal plane array dies 1242 are to be bonded. Handle wafer 1240 and its plurality of focal plane array dies 1242 can be processed according to processes similar to processes taught herein. The structural architecture of focal plane array dies 1242 can be based on architectures in accordance with architectures taught herein, Although specific embodiments have been illustrated and described herein, it will be appreciated by those of ordinary skill in the art that any arrangement that is calculated to achieve the same purpose may be substituted for the specific embodiments shown. Upon studying the disclosure, it will be apparent to those skilled in the art that various modifications and variations can be made in the devices and methods of various embodiments of the invention. Various embodiments can use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
    a focal plane array having an array of photosensitive pixels, each photosensitive pixel includes:
        an electrical contact arranged to couple to a circuit external to the focal plane array;
        a photodetector conductively coupled to the electrical contact; and
        a contact plane conductively coupled to the photodetector and disposed on the photodetector such that arrangement of the contact plane provides an optical aperture to the photodetector, the contact plane being a flexible conductive layer.

2. The apparatus of claim 1, wherein the contact plane is a flexible metal, a flexible metal composite, a flexible conductive polymer, or a flexible conductive oxide.

3. The apparatus of claim 1, wherein the contact plane is disposed on edges of the photodetector such that arrangement of the contact plane on the edges provides the optical aperture to the photodetector.

4. The apparatus of claim 1, wherein the contact plane of each photosensitive pixel is common to the other photosensitive pixels of the focal plane array.

5. The apparatus of claim 1, wherein the apparatus includes the circuit bonded to the focal plane array.

6. The apparatus of claim 5, wherein the circuit is bonded to the focal plane array with a conductive bonding pad conductively coupled to the electrical contact of the photosensitive pixel.

7. The apparatus of claim 1, wherein each photosensitive pixel includes a frequency selective surface disposed on the photodetector within the optical aperture formed by the arrangement of the contact plane.

8. The apparatus of claim 7, wherein each photosensitive pixel includes a control gate arranged to isolate the photosensitive pixel from the other photosensitive pixels of the focal plane array.

9. The apparatus of claim 1, wherein each photosensitive pixel includes a control gate arranged to isolate the photosensitive pixel from the other photosensitive pixels of the focal plane array.

10. The apparatus of claim 1, wherein each photosensitive pixel includes a bottom contact to couple to the circuit on the same side of the photodetector that the electrical contact is arranged to couple to the circuit, the bottom contact electrically coupled to the contact plane.

11. The apparatus of claim 10, wherein the circuit is bonded to each photosensitive pixel of the focal plane array with a conductive bonding pad conductively coupled to the electrical contact of each respective photosensitive pixel and with another conductive bonding pad conductively coupled to the bottom contact.

12. The apparatus of claim 11, wherein each photosensitive pixel includes a frequency selective surface disposed on the photodetector within the optical aperture formed by the arrangement of the contact plane.

13. A method comprising:
   fabricating a focal plane array having a having an array of photosensitive pixels, the fabrication including:
      forming a photodetection region on a substrate for each photosensitive pixel;
      forming a contact plane on the photodetection region for each photosensitive pixel such that arrangement of the contact plane provides an optical aperture to a surface of the photodetection region, the contact plane being a flexible conductive layer;
      removing the substrate; and
      forming a conductive plane on the photodetection region for each photosensitive pixel to provide the respective photosensitive pixel with an electrical contact to couple to an external structure, the conductive plane disposed opposite the surface forming the optical aperture.

14. The method of claim 13, wherein forming the contact plane includes forming the contact plane composed of a flexible metal, a flexible metal composite, a flexible conductive polymer, or a flexible conductive oxide.

15. The method of claim 14, wherein the method includes forming, prior to forming the contact plane, an electrically insulating layer such that insulation material contacts and covers sides of the photodetection region from a top surface of the photodetection region to a bottom surface of the photodetection region.

16. The method of claim 13, wherein forming the contact plane includes forming the contact plane disposed on edges of the photodetection region such that arrangement of the contact plane on the edges provides the optical aperture to the contact plane.

17. The method of claim 13, wherein forming the contact plane includes forming the contact plane of each photosensitive pixel common to the other photosensitive pixels of the focal plane array.

18. The method of claim 15, wherein forming the photodetection region on the substrate includes forming the photodetection region onto an etch stop layer on the substrate.

19. The method of claim 13, wherein fabricating the focal plane array includes using three-dimensional semiconductor wafer processing techniques.

20. The method of claim 13, wherein the method includes:
   attaching a handle wafer such that the contact plane is between the handle wafer and the substrate;
   removing the substrate using the handle wafer;
   electrically coupling the conductive plane to a circuit on another wafer; and
   removing the handle wafer after electrically coupling the conductive plane to the circuit.

21. The method of claim 20, wherein attaching the handle wafer includes attaching a handle wafer having a temporary bond polymer to couple to the contact plane, the temporary bond polymer removable with removal of the handle wafer.

22. The method of claim 13, wherein fabricating the focal plane array includes fabricating the focal plane array as one of a plurality of focal plane arrays on a wafer and electrically coupling the conductive plane to the circuit includes electrically coupling the conductive plane to one of a plurality of circuits on the other wafer.

23. The method of claim 22, wherein electrically coupling the conductive plane to the circuit on the other wafer includes flip-chip bonding the conductive plane to the circuit.

24. The method of claim 13, wherein the method includes forming a frequency selective surface on the photodetection region for each photosensitive pixel and performing the forming of the contact plane on the photodetection region such that the frequency selective surface is within the optical aperture formed by the arrangement of the contact plane.

25. The method of claim 13, wherein the method includes, after forming the conductive plane:
   forming an electrically insulating layer partially on the conductive plane leaving access to a portion of the conductive plane and processing the electrically insulating layer with respect to the portion of the conductive contact such that the portion of the conductive contact is arranged to couple to the external structure; and
   forming a conductive contact on the electrically insulating layer extending to and contacting the contact plane, the conductive contact arranged to couple to the external structure, electrically isolated from the coupling of the portion of the conductive contact to the external structure.

26. The method of claim 25, wherein the method includes forming a frequency selective surface on the photodetection region for each photosensitive pixel and performing the forming of the contact plane on the photodetection region such that the frequency selective surface is within the optical aperture formed by the arrangement of the contact plane.

27. The method of claim 13, wherein the method includes:
   forming a frequency selective surface on the photodetection region for each photosensitive pixel and performing the forming of the contact plane on the photodetection region such that the frequency selective surface is within the optical aperture formed by the arrangement of the contact plane; and forming a control gate coupled to the photodetection region such that each photosensitive pixel is electrically isolated from the other each photosensitive pixels of the focal plane array.

28. The method of claim 13, wherein the method includes forming a control gate coupled to the photodetection region such that each photosensitive pixel is electrically isolated from the other each photosensitive pixels of the focal plane array.

* * * * *